(12) United States Patent
Gleason et al.

(10) Patent No.: US 10,714,956 B2
(45) Date of Patent: Jul. 14, 2020

(54) APPARATUS, SYSTEM, AND METHOD FOR BATTERY CHARGING

(71) Applicants: Adam Gleason, Draper, UT (US); Manti Gleason, Draper, UT (US)

(72) Inventors: Adam Gleason, Draper, UT (US); Manti Gleason, Draper, UT (US)

( * ) Notice: Subject to any disclaimer, the term of this patent is extended or adjusted under 35 U.S.C. 154(b) by 0 days.

(21) Appl. No.: 16/149,084

(22) Filed: Oct. 1, 2018

(65) Prior Publication Data
US 2019/0036350 A1 Jan. 31, 2019

Related U.S. Application Data

(63) Continuation-in-part of application No. 15/480,184, filed on Apr. 5, 2017, now Pat. No. 10,361,577.

(60) Provisional application No. 62/318,689, filed on Apr. 5, 2016.

(51) Int. Cl.
| | |
|---|---|
| *H02J 7/00* | (2006.01) |
| *G01R 31/387* | (2019.01) |
| *G01R 31/392* | (2019.01) |
| *H01M 10/48* | (2006.01) |
| *H01M 10/613* | (2014.01) |
| *H01M 10/6563* | (2014.01) |
| *H01M 10/42* | (2006.01) |

(52) U.S. Cl.
CPC ............ *H02J 7/007* (2013.01); *G01R 31/387* (2019.01); *G01R 31/392* (2019.01); *H01M 10/486* (2013.01); *H01M 10/613* (2015.04); *H01M 10/6563* (2015.04); *H02J 7/008* (2013.01); *H02J 7/0021* (2013.01); *H02J 7/00036* (2020.01); *H02J 7/0045* (2013.01); *H02J 7/0091* (2013.01); *H02J 7/007192* (2020.01); *H01M 10/425* (2013.01); *H02J 7/00034* (2020.01)

(58) Field of Classification Search
CPC ....... Y02E 60/12; H02J 7/0042; H02J 7/0045; H01M 10/46; H01M 10/44
See application file for complete search history.

(56) References Cited

U.S. PATENT DOCUMENTS

| | | | |
|---|---|---|---|
| 4,314,008 A | | 2/1982 | Blake |
| 5,343,086 A | | 8/1994 | Fung et al. |
| 5,541,490 A | * | 7/1996 | Sengupta ........... G01R 31/3648 320/160 |
| 5,703,470 A | | 12/1997 | Baranowski et al. |
| 5,795,664 A | | 8/1998 | Kelly |
| 5,934,079 A | | 8/1999 | Han et al. |
| 6,040,683 A | | 3/2000 | Mottier |
| 6,057,050 A | | 5/2000 | Parise |
| 6,455,186 B1 | | 9/2002 | Moores, Jr. et al. |
| 6,633,171 B2 | | 10/2003 | Brown et al. |
| 6,653,002 B1 | | 11/2003 | Parise |

(Continued)

FOREIGN PATENT DOCUMENTS

WO 2015/028964 A1 3/2015

*Primary Examiner* — Arun C Williams
(74) *Attorney, Agent, or Firm* — Kunzler Bean & Adamson

(57) ABSTRACT

Apparatuses, systems, and methods are presented for battery charging. A charging connector may connect to power terminals of a battery. A data connector may connect to a battery. A charger controller may read battery data from a battery via a data connector and charge the battery by supplying a power level to the battery via a charging connector. A power level may be based on battery data.

17 Claims, 10 Drawing Sheets

(56) References Cited

U.S. PATENT DOCUMENTS

| | | |
|---|---|---|
| 6,952,748 B1 | 10/2005 | Guerrero, Jr. et al. |
| 7,061,208 B2 | 6/2006 | Nishihata et al. |
| 7,253,586 B2 | 8/2007 | Kangas et al. |
| 7,570,015 B2 | 8/2009 | Bansal et al. |
| 7,663,344 B2 | 2/2010 | Le Gall et al. |
| 8,063,607 B2 | 11/2011 | Crawford et al. |
| 8,446,127 B2 | 5/2013 | Yazami et al. |
| 8,595,122 B2 | 11/2013 | Kamer et al. |
| 8,658,299 B2 | 2/2014 | Yang et al. |
| 8,692,506 B2 | 4/2014 | Saito et al. |
| 8,722,222 B2 | 5/2014 | Kossakovshi et al. |
| 8,915,091 B2 | 12/2014 | Goenka |
| 8,974,942 B2 | 3/2015 | Bell et al. |
| 9,827,872 B1 * | 11/2017 | Sloan .................. B60L 11/1874 |
| 2005/0052160 A1 | 3/2005 | Bushong et al. |
| 2006/0028182 A1 | 2/2006 | Yang et al. |
| 2007/0115696 A1 | 5/2007 | Berghegger |
| 2009/0096427 A1 | 4/2009 | Yang |
| 2010/0112419 A1 | 5/2010 | Jang et al. |
| 2010/0283424 A1 | 11/2010 | Tarter et al. |
| 2011/0316486 A1 | 12/2011 | Inaba et al. |
| 2012/0019196 A1 | 1/2012 | Fung |
| 2012/0019215 A1 | 1/2012 | Wenger et al. |
| 2012/0116699 A1 * | 5/2012 | Haag .................... B60L 3/0046 702/63 |
| 2012/0308854 A1 | 12/2012 | Schaefer et al. |
| 2014/0030560 A1 | 1/2014 | Lev et al. |
| 2015/0064534 A1 | 3/2015 | Lohmann et al. |
| 2015/0372513 A1 | 12/2015 | Choi et al. |
| 2017/0072813 A1 | 3/2017 | Martin et al. |

\* cited by examiner

APPARATUS, SYSTEM, AND METHOD FOR BATTERY CHARGING

CROSS-REFERENCES TO RELATED APPLICATIONS

This is a continuation-in-part application of and claims priority to U.S. patent application Ser. No. 15/480,184 entitled "BATTERY CHARGING AND COOLING APPARATUS" and filed on Apr. 5, 2017, for Adam Gleason et al., which claims the benefit of U.S. Provisional Patent Application No. 62/318,689 entitled "BATTERY CHARGING AND COOLING APPARATUS" and filed on Apr. 5, 2016, for Adam Gleason et al., each of which is incorporated herein by reference.

BACKGROUND

Using batteries to power certain devices such as drones or power tools may rapidly discharge and heat the batteries. Batteries may be out of service for lengthy periods of time while charging, thus preventing further use of a device, unless additional batteries are obtained at additional expense. Attempting to charge batteries faster to return them to use sooner may cause damage that reduces the lifetime of the batteries, or that causes safety problems.

SUMMARY

Apparatuses are presented for battery charging. In one embodiment, a charging connector is configured to connect to power terminals of a battery. In a certain embodiment, a data connector is configured to connect to a battery. In a further embodiment, a charger controller is configured to read battery data from a battery via a data connector. In certain embodiments, a charger controller is configured to charge a battery by supplying a power level to the battery via a charging connector. In further embodiments, a power level may be based on battery data.

In one embodiment, a data connector includes one or more electrical conductors distinct from electrical conductors of a charging connector. In a certain embodiment, reading battery data may include reading a charge cycle count for a battery, a battery identifier, a battery temperature, a temperature per cell, a battery current, a current per cell, a battery voltage, a voltage per cell, a battery state-of-charge (SOC) percentage, and/or one or more safety alert flags.

In one embodiment, a charger controller is configured to set a completion threshold based on battery data, and to charge a battery until the completion threshold is satisfied. In a certain embodiment, a charger controller supplies a power level based on battery data by ramping up an applied voltage based on the battery data. In some embodiments, a charger controller may supply a power level based on battery data by iteratively applying an over-target voltage to a battery, and removing the over-target voltage. The charger controller may supply and remove an over-target voltage iteratively, based on battery data, until a completion threshold is satisfied. In one embodiment, a charger controller is configured to perform a deep cycle discharge of a battery, prior to charging the battery, based on battery data other than a charge cycle count.

In certain embodiments, an apparatus may include a cooling chamber. In a further embodiment, a cooler may be connected to a cooling chamber. In one embodiment, a battery slot may be at least partially cooled by a cooling chamber. In a certain embodiment, a battery slot may be configured to receive a battery. In some embodiments, a charger controller is configured to operate a cooler to control a temperature of a battery. In certain embodiments, a charger controller operates a cooler to control a temperature of a battery by cooling the battery prior to charging, and/or by maintaining a battery temperature during charging.

In one embodiment, battery data read by a charger controller includes initial data and additional data read by the charger controller while charging a battery. In a further embodiment, a charger controller is configured to store battery data, and to provide a user with access to the stored data. In one embodiment, a charger controller is configured to provide a user with a predicted remaining lifetime for a battery based on a battery data. In a certain embodiment, a charger controller is configured to retire a battery from use based on a battery data.

Systems are presented for battery charging. In one embodiment, a system includes a battery configured to provide power to an electrical device, and a charging apparatus separate from the electrical device. A charging apparatus, in certain embodiments, includes a charging connector, a data connector, and a charger controller. A charging connector, in one embodiment, is configured to connect to power terminals of a battery. A data connector, in one embodiment, is configured to connect to a battery. A charger controller, in one embodiment, is configured to read battery data from a battery via a data connector, and to charge the battery by supplying a power level to the battery via a charging connector. In further embodiments, a power level may be based on battery data.

In one embodiment, a charger controller is configured to set a completion threshold based on battery data, and to charge a battery until the completion threshold is satisfied. In a certain embodiment, a charger controller may supply a power level based on battery data by ramping up an applied voltage based on the battery data. In some embodiments, a charger controller may supply a power level based on battery data by iteratively applying an over-target voltage to a battery, and removing the over-target voltage. A charger controller may iteratively apply and remove an over-target voltage based on battery data until a completion threshold is satisfied.

In a certain embodiment, a charging apparatus of a system for battery charging includes a cooling chamber. In a further embodiment, a cooler is connected to a cooling chamber. In one embodiment, a battery slot is at least partially cooled by a cooling chamber. In a certain embodiment, a battery slot is configured to receive a battery. In a further embodiment, a charger controller is configured to operate a cooler to control a temperature of a battery.

Methods are presented for battery charging. A method, in one embodiment, includes connecting a charging connector to power terminals of a battery. In a certain embodiment, a method includes connecting a data connector to a battery. In a further embodiment, a method includes reading battery data from a battery via a data connector. In one embodiment, a method includes charging a battery by supplying a power level to the battery via a charging connector. In a further embodiment, a power level supplied to a battery is based on battery data.

In a certain embodiment, a method includes setting a completion threshold based on battery data. In a further embodiment, a method includes charging a battery until a completion threshold is satisfied.

In one embodiment, supplying a power level based on battery data includes ramping up an applied voltage based on the battery data. In a certain embodiment, supplying a power level based on battery data includes iteratively applying an over-target voltage to a battery, and removing the over-target voltage. In certain embodiments, a method may include iteratively supplying and removing an over-target voltage, based on battery data, until a completion threshold is satisfied.

In a certain embodiment, a method includes providing a cooling chamber. In a further embodiment, a method includes providing a cooler connected to a cooling chamber. In one embodiment, a method includes providing a battery slot at least partially cooled by a cooling chamber. In certain embodiments, a method includes receiving a battery in a battery slot. In a further embodiment, a method includes operating a cooler to control a temperature of a battery.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention, and are not therefore to be considered to be limiting of its scope, the invention will be described and explained with additional specificity and detail through the use of the accompanying drawings, in which.

DETAILED DESCRIPTION

Figure 1:
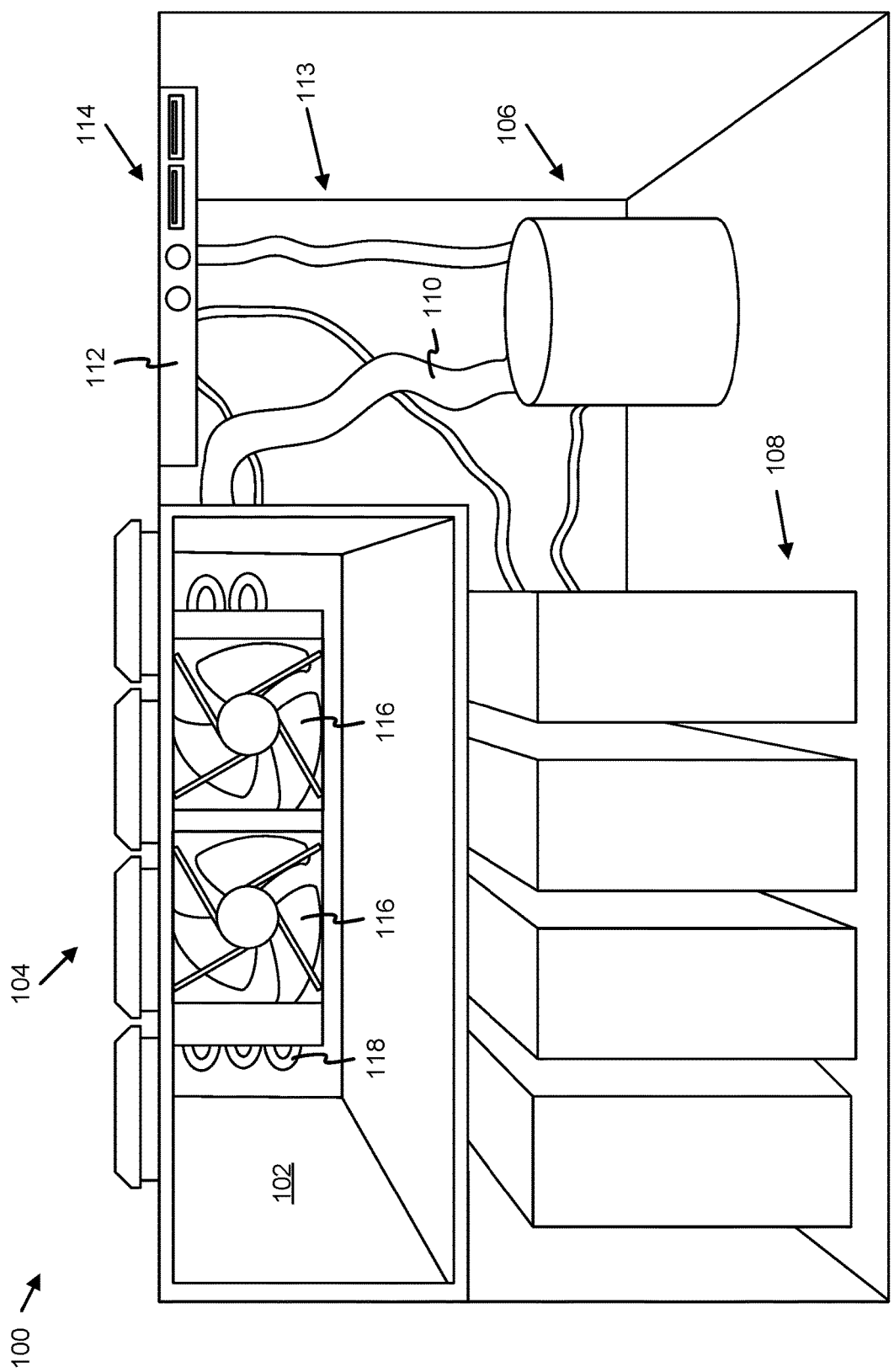
FIG. 1 is a cutaway perspective view illustrating one embodiment of a battery charging and cooling apparatus.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

These features and advantages of the embodiments will become more fully apparent from the following description and appended claims, or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Some functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer readable medium may be a tangible computer readable storage medium storing the program code.

The computer readable storage medium may be, for example, but not limited to, an electronic, magnetic, optical, electromagnetic, infrared, holographic, micromechanical, or semiconductor system, apparatus, or device, or any suitable combination of the foregoing.

More specific examples of the computer readable storage medium may include but are not limited to a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), an optical storage device, a magnetic storage device, a holographic storage medium, a micromechanical storage device, or any suitable combination of the foregoing. In the context of this document, a computer readable storage medium may be any tangible medium that can contain, and/or store program code for use by and/or in connection with an instruction execution system, apparatus, or device.

The computer readable medium may also be a computer readable signal medium. A computer readable signal medium may include a propagated data signal with program code embodied therein, for example, in baseband or as part of a carrier wave. Such a propagated signal may take any of a variety of forms, including, but not limited to, electrical, electro-magnetic, magnetic, optical, or any suitable combination thereof. A computer readable signal medium may be any computer readable medium that is not a computer readable storage medium and that can communicate, propagate, or transport program code for use by or in connection with an instruction execution system, apparatus, or device. Program code embodied on a computer readable signal medium may be transmitted using any appropriate medium, including but not limited to wire-line, optical fiber, Radio Frequency (RF), or the like, or any suitable combination of the foregoing In one embodiment, the computer readable medium may comprise a combination of one or more computer readable storage mediums and one or more computer readable signal mediums. For example, program code may be both propagated as an electro-magnetic signal through a fiber optic cable for execution by a processor and stored on RAM storage device for execution by the processor.

Program code for carrying out operations for aspects of the present invention may be written in any combination of one or more programming languages, including an object oriented programming language such as Java, Smalltalk, C++, PHP or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by program code. The program code may be provided to a processor of a general purpose computer, special purpose computer, sequencer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The program code may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The program code may also be loaded onto a computer, other programmable data processing apparatus, or other devices to cause a series of operational steps to be performed on the computer, other programmable apparatus or other devices to produce a computer implemented process such that the program code which executed on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

FIG. 1 depicts one embodiment of an apparatus 100 for battery charging and cooling. In one embodiment, the apparatus 100 may include a cooling chamber 102. In some embodiments, the apparatus 100 may include a battery slot 104. The battery slot 104 may be at least partially cooled by the cooling chamber 102. In one embodiment, the apparatus 100 may include a cooler 106. The cooler 106 may be connected to the cooling chamber 102. In one embodiment, the apparatus 100 may include a power source 108. The power source 108 may be in electrical communication with the cooler 106.

In one embodiment, the apparatus 100 includes a cooling chamber 102. The cooling chamber 102 may be sized, shaped, or the like to surround at least a portion of one or more batteries. In one embodiment, the cooling chamber 102 may include an insulated enclosure. The cooling chamber 102 may include an insulating material that may prevent heat from entering the space inside the cooling chamber 102 or may prevent cool air from escaping the space inside cooling chamber 102. As used herein, "preventing heat from entering . . . or preventing cool air from escaping . . . " or similar phrases may include preventing a substantially amount of heat from entering/cool air from escaping. This may be because a material may not perfectly insulate. The cooling chamber 102 may include one or more openings, apertures, or the like. An opening maybe disposed proximal to a battery slot 104, described below.

In one embodiment, the cooling chamber 102 may include a fan 116. The fan 116 may circulate air in the cooling chamber 102. The fan 116 may circulate air in the cooling chamber 102 to assist the cooling chamber 102 in having a substantially uniform temperature. In one embodiment, the fan 116 may include multiple fans 116. In one embodiment, the cooling chamber 102 may include a heat exchanger 118. The heat exchanger 118 may be configured to receive a coolant from the cooler 106. The heat exchanger 118 may be configured to extract heat from the cooling chamber 102. In one embodiment, heat from a battery in the cooling chamber 102 may dissipate into the cooling chamber 102 and the heat exchanger 118 may extract that heat from the cooling chamber 102.

In one embodiment, the apparatus 100 includes a battery slot 104. The battery slot 104 may be at least partially cooled by the cooling chamber 102. In one embodiment, the battery slot 104 being at least partially cooled by the cooling chamber 102 may include the cooling chamber 102 removing heat from a battery inserted into the battery slot 104. The battery slot 104 may be disposed proximal to the cooling chamber 102. For example, as shown in FIG. 1, the battery slot 104 may be disposed on an upper side of the cooling chamber 102. The battery slot 104 being disposed on an upper side of the cooling chamber 102 may allow a portion of the battery to rest in the cooling chamber 102 in response to being inserted into the battery slot 104. In some embodiments, the battery slot 104 may be disposed on a side of the cooling chamber 102 or on another portion of the cooling chamber 102.

In a certain embodiment, the battery slot 104 is configured to receive a battery. For example, in certain embodiments, a battery slot 104 may be sized, shaped, or the like to receive a specific type of battery. In one embodiment, the battery slot 104 may include one or more adjustable portions. The one or more adjustable portions may adjust the size, shape, or the like of the battery slot 104. Adjusting one or more portions of the battery slot 104 may include accommodating different types of batteries to be inserted into the battery slot 104.

In one embodiment, the battery slot 104 may include multiple battery slots 104. For example, as shown in FIG. 1, multiple battery slots 104 may include four battery slots 104. In some embodiments, the multiple battery slots 104 may include fewer or more than four battery slots 104. The adjustable portions of the multiple battery slots 104 may allow for simultaneous cooling and charging of different types of batteries. The battery slot 104 may be shaped, sized, or the like to prevent heat from entering the cooling chamber 102 through the battery slot 104.

In some embodiments, a battery may be configured to provide power to an electrical device, such as a drone, a power tool, or the like. For example, a battery may include a drone battery, a power tool battery, or another battery. In further embodiments, the battery may be removable from the electrical device for charging, and the apparatus 100 may be separate from the electrical device powered by the battery, so that the battery is coupled to the electrical device for use, removed from the electrical device after use, and coupled to the apparatus 100 for charging. For example, in one embodiment, the battery slot 104 may be configured to receive a DJI-brand TB47 or TB48 battery. The battery may include a lithium-ion battery. In some embodiments, a battery may not charge at certain temperatures. A battery may include one or more temperatures above or below which the battery may not charge. For example, a certain battery may not charge above 30° C. (approx. 86° F.). In some embodiments, a battery may charge faster or slower at certain temperatures. A battery may include a temperature at which the battery may charge the fastest. For example, a battery may charge the fastest at 5° C. (41° F.).

Figure 2:
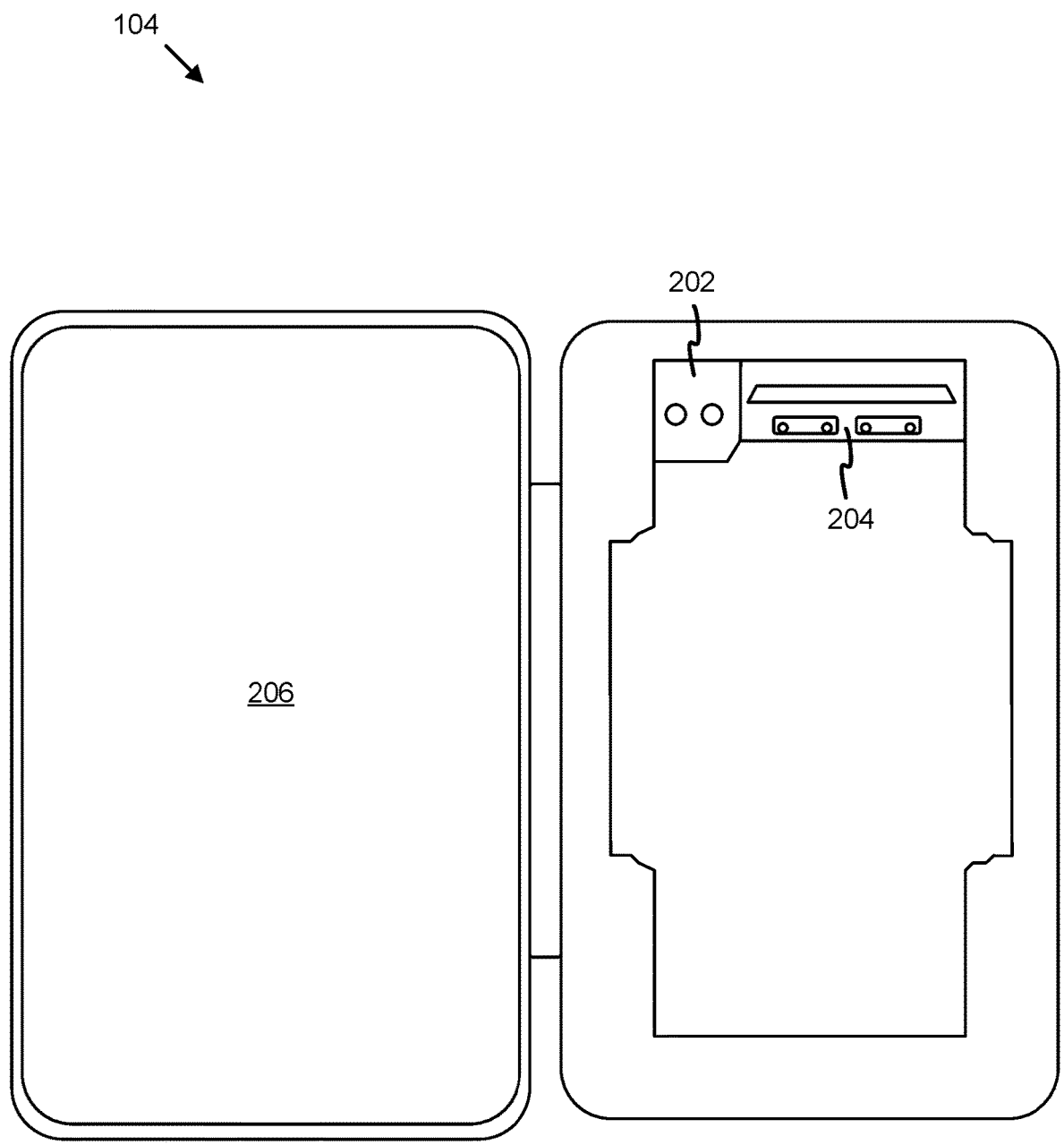
FIG. 2 is a top down view illustrating one embodiment of a battery slot.

FIG. 2 depicts one embodiment of a battery slot 104. In one embodiment, the battery slot 104 may include one or more battery connectors. A battery connector may include a connector that engages with a terminal of a battery inserted into the battery slot 104. The battery connector may selectively engage with a terminal of the battery. A battery connector may receive one or more signals, charges, or the like from the battery and propagate those signals, charges, or the like to another portion of the apparatus 100. In some embodiments, one or more portions of the apparatus 100 may send one or more signals, charges, or the like to a battery connector and the battery connector may propagate those one or more signals, charges, or the like to a battery in the battery slot 104.

In one embodiment, a battery connector may include a charging connector 202. The charging connector 202 may include one or more metal tabs, blades, spades, pins, sockets, plugs, or the like. Various other or further electrical connectors suitable for use as a charging connector 202 will be clear in view of this disclosure. In certain embodiments, a charging connector 202 may include a positive connector and/or a negative connector. The positive connector may engage with a positive terminal and the negative connector may engage with the negative terminal of the battery inserted into the battery slot 104. The positive and negative connectors may receive power from one or more portions of the apparatus 100 (for example, from the power source 108, as described below) to charge the battery in the battery slot 104. In one embodiment, the positive and negative connectors may supply power to one or more portions of the apparatus 100.

In one embodiment, a battery connector may include a data connector 204. The data connector 204 may include one or more data pins, spring-loaded pogo pins, spades, posts, a plug connector, a socket connector, a pin header, a Japan Solderless Terminal (JST) connector, or the like. Various other or further types of electrical connectors suitable for use as a data connector 204 will be clear in view of this disclosure. The data connector 204 may receive one or more signals representing one or more portions of data from the battery inserted into the battery slot 104. The data connector 204 may propagate the received data to one or more portions of the apparatus 100. The data connector 204 may receive data from one or more portions of the apparatus 100 and propagate that data to the battery. In one embodiment, the data may include data about the battery. For example, the data may include a charge or discharge rate of the battery, the temperature of the battery, a temperature history of the battery, a status of the battery, or the like.

In one embodiment, the battery slot 104 may include a lid 206. The lid 206 may selectively cover the battery slot 104. In one embodiment, the lid 206 may cover the battery slot 104 in response to a battery being inserted into the battery slot 104. For example, the lid 206 may cover the battery while the battery is in the battery slot 104. In one embodiment, the lid 206 may cover the battery slot 104 in response to no battery being present in the battery slot 104. The lid 206 may prevent heat from entering the cooling chamber 102. The lid 206 may include a variety of forms. For example, the lid 206 may be connect to the battery slot 104 or another portion of the apparatus 100 with a rotatable hinge. The hinge may be disposed on a top, bottom, or side of the battery slot 104. In one embodiment, the lid 206 may snap onto the battery slot 104 or another portion of the apparatus 100.

In one embodiment, the apparatus 100 may include multiple cooling chambers 102. For example, in one embodiment, each battery slot 104 of multiple battery slots 104 may include a corresponding cooling chamber 102 disposed proximal to the battery slot 104. The cooler 106, described below, may cool each cooling chamber 102 to a different temperature. In some embodiments, different batteries may include different temperatures at which the battery charges the fastest, most efficiently, or the like. The separate cooling chambers 102 may allow the simultaneous charging of these different batteries.

Returning to FIG. 1, in one embodiment, the apparatus 100 may include a cooler 106. The cooler 106 may receive power from the power source 108, as described below. The cooler 106 may connect to the cooling chamber 102 through the coolant channel 110. In one embodiment, in response to receiving power, the cooler 106 may transfer heat away from the battery slot 104 and cool the battery inside the battery slot 104. The cooler 106 may transfer heat away from or extract heat from the battery by supplying the heat exchanger 118 with a coolant that extracts heat from the cooling chamber 102 as described above. The cooler 106 may supply coolant to the heat exchanger 118 through the coolant channel 110.

In one embodiment, the cooler 106 may be disposed at least partially inside the cooling chamber 102. The cooler 106 may include the heat exchanger 118, the fan 116, or the like. In one embodiment, the cooler 106 may couple to the battery slot 104, be disposed on the battery slot 104, be disposed proximal to the battery slot 104, or the like. In one embodiment, the cooler 106 may couple to the cooling chamber 102. The cooler 106 may transfer heat away from the battery slot 104, the battery inserted into the battery slot 104, or the like. In one embodiment, the cooler 106 may transfer heat outside the cooling chamber 102. For example, in one embodiment, the cooler 106 may be disposed proximal to an aperture in the apparatus 100. The aperture may be disposed proximal to a fan and the cooler 106 may transfer heat toward the fan. The fan may be disposed proximal to the cooling chamber 102 or another portion of the apparatus 100.

In one embodiment, one or more components of the apparatus 100 or a component associated with the apparatus 100 may include one or more temperature thresholds. For example, a battery, battery slot 104, the cooling chamber 102, or the like may each include one or more temperature thresholds. In response to the temperature of the component reaching a certain temperature threshold, the cooler 106 may reduce the rate at which the cooler 106 cools the cooling chamber 102. Reducing the rate of cooling may include ceasing to cool the cooling chamber 102, a battery slot 104, or a battery inserted into the battery slot 104. In one embodiment, reducing a rate of cooling or ceasing cooling may reduce the amount of power the cooler 106 consumes. The cooler 106 ceasing to cool may include the cooler 106 deactivating. In certain embodiments, the temperature threshold of the component may include a predetermined threshold. In one embodiment, the temperature threshold may be calculated, received from an external source (e.g. the battery, user input, or the like).

In one embodiment, the cooler 106 may include a thermoelectric cooling element. The thermoelectric cooling element may include a thermoelectric heat pump. The thermoelectric heat pump may transfer heat from one side of the pump to the other. The thermoelectric cooling element may include a hot side and a cold side. An electric current may flow through the thermoelectric cooling element. In response to the electric current, the cold side may transfer heat to the hot side. In response to the cold side transferring heat, the cold side may become cooler. In one embodiment, the hot side may couple to a heat sink.

In one embodiment, the thermoelectric cooling element may be disposed inside the cooling chamber 102. In one embodiment, the hot side may be disposed toward a fan, for example, the fan 116 or another fan. In one embodiment, the hot side may be disposed on the outside of the cooling chamber 102. The cold side may be disposed on the inside of the cooling chamber 102. In one embodiment, in response to the thermoelectric cooling element transferring heat from the cold side to the hot side, the temperature of the interior of the cooling chamber 102 may decrease. In response to the temperature of the interior of the cooling chamber 102 decreasing, the temperatures of a battery in the battery slot 104 may decrease.

In some embodiments, the thermoelectric cooling element may provide heat to the battery inside the battery slot 104. Heating the battery may raise the temperature of the battery. The thermoelectric cooling element may transfer heat from the cold side to the hot side. The hot side may be disposed towards the battery slot 104, batteries, or the inside of the cooling chamber 102. In some embodiments, the thermoelectric cooling element may include multiple thermoelectric cooling elements, for example, one thermoelectric cooling element for cooling the battery and one thermoelectric cooling element for heating the battery.

In one embodiment, the cooler 106 may include a refrigerant cooling element. The refrigerant cooling element may include the heat exchanger 118. In one embodiment, the heat exchanger 118 may include an evaporator coil. The evaporator coil may be disposed inside the cooling chamber 102.

In some embodiments, a compressor may drive the evaporator coil, the heat exchanger 118 or a fan. The compressor may receive power from a power source, such as the power source 108. The compressor may be disposed inside the cooling chamber 102 or proximal to the cooling chamber 102. In some embodiments, the compressor may be disposed in another location in relation to the apparatus 100. In one embodiment, the refrigerant may include FREON or the like.

In one embodiment, the apparatus 100 may include a power source 108. A power source 108 may supply power to the apparatus 100 or one or more portions, components, or the like of the apparatus 100. The power source 108 may supply power to the charging connector 202 of the battery slot 104. The charging connector 202 may propagate the power to the battery inserted into the battery slot 104 and charge the battery. In one embodiment, the power includes electricity. The power source 108 may include a power adapter (for example, an AC/DC or DC/DC adapter or the like), a power supply, a connector (for example, a DC connector, mains power connector, or the like), or one or more other electronic devices that supply electrical energy to the apparatus 100 or one or more portions of the apparatus 100. In one embodiment, a power supply may include multiple power supplies.

In one embodiment, the power source 108 may receive power from an external power source. For example, the power source 108 may receive power from a wall socket, a generator, a battery, or the like. The external power source may supply electricity to the power source 108 at different voltages. For example, a certain external power source may supply electricity to the power source 108 at 100 volts (V), 240V, or another voltage. In one embodiment, the power source 108 or another portion of the apparatus 100 may include a selector switch. The selector switch may toggle the voltage at which the power source 108 receives power. A user may adjust the selector switch to toggle the voltage at which the power source 108 receives power. In one embodiment, the power source 108 or another portion of the apparatus 100 may automatically detect the voltage of input power and, in response to detecting the voltage, toggle the voltage at which the power source 108 receives power.

In one embodiment, the power source 108 may receive power from the battery inserted into the battery slot 104. In some embodiments, a battery may hold a charge longer, discharge at a more efficient rate, or may otherwise perform more efficiently or better in response to completely discharging. In one embodiment, the term "deep cycling" may include the battery discharging from its remaining charge and supplying the discharge to the power source 108. In some embodiments, a battery may perform better in response to being deep cycled at a regular interval (e.g. every ten charges, every five charges, or the like). In response to deep cycling the battery, the battery may heat up. By using the discharge of the battery to power the power source 108, and thus, the cooler 106, in response to deep cycling, the cooler 106 may cool the battery and keep its temperature lower in preparation or in response to charging the battery.

In one embodiment, a user may configure the apparatus 100 to deep cycle a battery after a number of times the battery has been charged, as configured by the user. In one embodiment, the battery may store the number of times it has been charged, or the number of charge cycles it has been subjected to. In one embodiment, the apparatus 100 may store the number of times it has charged a certain battery. In one embodiment, the apparatus 100 may receive charge data, such as the number of charges, number of charges since the last deep cycle, or the like, of the battery from the data connector 204. The apparatus 100 may receive battery data, such as a piece of data unique to a battery that identifies the battery, from the data connector 204.

In one embodiment, the apparatus 100 includes a charging port 114. The charging port 114 may supply power from the power source 108 to an external device. In one embodiment, the charging port 114 may include a Universal Serial Bus (USB) port. The USB port may include Type-A, Type-B, Type-C, or another type. In certain embodiments, the charging port 114 may include an auxiliary port for a specific type of device. The charging port 114 may receive a connector from an external device and supply power through the connector. For example, in one embodiment, the charging port 114 may include an auxiliary port for a drone controller. In one embodiment, the charging port 114 may include multiple charging ports 114. The multiple charging ports 114 may include one or more charging ports 114 of different types.

In one embodiment, the power source 108 may supply power to the charging port 114. The power source 108 may supply power to the charging port 114 at differing voltages. For example, in one embodiment, the power source 108 may supply power to a USB port at 5V, less than 5V, or greater than 5V. The power source 108 may supply power to a USB port at 3.1 amps, less than 3.1 amps (for example, 2.1 amps), or greater than 3.1 amps. In one embodiment, the power source 108 may supply power to an auxiliary port at 26.3V, less than 26.3V, or greater than 26.3V. The power source 108 may supply power to an auxiliary port at 180 watts, less than 180 watts (for example, 100 watts), or greater than 180 watts.

In one embodiment, the charging port 114 may supply power to the power source 108. The device connected to the apparatus 100 via the charging port 114 may deep cycle. The deep cycling may include a deep cycling similar to the deep cycling of the battery, as described above.

In one embodiment, the apparatus 100 includes a charger controller 112. The charger controller 112 may be in electrical communication with the power source 108, the cooler 106, the battery slot 104, or the charging port 114. In some embodiments, the charger controller 112 may be in electrical communication through one or more cables 113. The one or more cables may include one or more cables, wires, or the like. In one embodiment, the charger controller 112 may include hardware, software, and/or a combination of hardware, software, and/or other components as described above. The charger controller 112 may distribute a total available power from the power source 108 to the battery slot 104, cooler 106, and charging port 114. In some embodiments, distributing power may include the charger controller 112 directing the power source 108 to supply power to one or more battery slots 104 or charging ports 114 at different rates, levels, or the like. In some embodiments, directing power may include hardware of the charger controller 112 distributing power, software of the charger controller 112 executing instructions, or the like in response to receiving input from a user.

In one embodiment, distributing power may include the charger controller 112 directing the power source 108 to supply power to one or more components of the apparatus 100, such as one or more components of the charger controller 112, the battery slot 104, cooler 106, charging ports 114, or the like. Distributing power may include the charger controller 112 directing the power source 108 to power to one or more specified battery slots 104 or charging ports 114. In some embodiments, distributing power may include the charger controller 112 directing the power source 108 to supply power to an unpowered portion of the apparatus 100 or to supply additional power to an already-powered portion of the apparatus 100. The charger controller 112 may distribute power based, at least in part, on input received from a user. In one embodiment, the charger controller 112 may distribute power, at least in part, based on default parameters, settings, configurations, or the like. The charger controller 112 may distribute power, at least in part, based on data, signals, or the like received from a battery inserted in the battery slot 104.

In one embodiment, the total available power from the power source 108 may include a range. For example, in one embodiment, the total available power may include the range of 100 watts to 1200 watts. The range may include a different range. In one embodiment, the charger controller 112 may adjust the total available power. The charger controller 112 may adjust the total available power in response to user input.

In some embodiments, the charger controller 112 may be configured to read battery data from the data connector 204. The charger controller 112 may be configured to direct power from the power source 108 to the charging connector 202 based on the battery data. For example, the charger controller 112 may read temperature data from the battery. Based on that temperature data, the charger controller 112 may adjust a charge supplied to the battery from the power source 108. In one embodiment, the charger controller 112 directing power from the power source 108 to the charging connector 202 may include the cooler 106 adjusting its operation to maintain the battery at a predetermined temperature, lower the temperature of the battery, or raise the temperature of the battery.

In one embodiment, the battery slot 104 may include multiple battery slots 104. The charger controller 112 may be configured to read data from battery data from each battery inserted into the battery slots 104. The power source 108 may supply power to the charging connector 202 of at least one battery slot 104 based on the battery data from the multiple battery slots 104. In one embodiment, the charger controller 112 may be configured to read data from the charging port 114. For example, the charger controller 112 may receive data from a USB port. The data may include a charge level of a device connected via the USB port, other device data, or the like.

In one embodiment, the charger controller 112 may distribute used power and unused power to one or more portions of the apparatus 100. Used power may include power consumed by one or more portions of the apparatus 100. Unused available power may include the total available power minus the used power. For example, in one embodiment, the total available power may include 1200 watts and one or more portions of the apparatus 100 may use 700 watts (the used power). In this example, the unused available power is 500 watts (1200 watts minus 700 watts). In one embodiment, the used power may increase and the unused power may decrease in response to the charger controller 112 distributing power to one or more portions of the apparatus 100. The used power may decrease and the unused power may increase in response to the charger controller 112 distributing less power or ceasing to distribute power to one or more portions of the apparatus 100.

For example, in one embodiment, the total available power may include 1200 watts. The apparatus 100 may charge one device via a USB slot, two devices via two auxiliary slots, and one battery in a battery slot 104. Charging the device plugged into the USB slot may consume 15.5 watts. Charging the two devices plugged into the two auxiliary slots may each consume 180 watts. The cooler 106 may consume 500 watts. Charging the battery may consume the remaining power (324.5 watts).

In one embodiment, the total available power may include 1200 watts. In one embodiment, the apparatus 100 may charge four batteries in four battery slots 104. In one embodiment, the cooler 106 may consume 600 watts and charging the batteries may consume remaining power (150 watts each).

In one embodiment, the total available power may include 500 watts. The apparatus 100 may charge one device via a USB slot, one device via an auxiliary slot, and one battery in the battery slot 104. Charging the USB device may consume 15.5 watts and charging the auxiliary device may consume 180 watts. The cooler 106 may consume 200 watts. Charging the battery may consume the remaining power (104.5 watts).

In one embodiment, the total available power may include 100 watts. The apparatus 100 may charge one battery. Charging the battery may consume the available power (100 watts). The cooler 106 may not receive power and, thus, not cool the cooling chamber 102.

In one embodiment, the total available power may include 1200 watts. The apparatus 100 may charge one battery. The cooler 106 may consume 400 watts. Charging the battery may consume 600 watts. The remaining power (200 watts) may be unused.

In one embodiment, the charger controller 112 may include a data input/output interface. The data input/output interface may be configured to receive power-directing data. The data input/output interface may be configured to direct power from the power source 108 to the charging connector 202 based on the power-directing data. The data input/output interface may include a variety of forms. For example, in one embodiment, the data input/output interface may include a network card, a wireless communication device, an I/O device (such as a keyboard, mouse, touchscreen, or the like), or the like. The data input/output interface may be in data communication with an external device. Being in data communication may include wired communication, for example, through a USB cable or the like. Being in data communication may include wireless communication, for example, WI-FI, BLUETOOTH, radio frequency, or the like.

In one embodiment, the charger controller 112 may include firmware. The firmware may include software or the like configured to control power distribution functions, communication functions, and like of the charger controller 112. The charger controller 112 may change the firmware. For example, the charger controller 112 may receive firmware updates from the data input/output interface. The firmware may include instructions related to directing power from the power source 108 to the charging connector 202, charging port 114, or other instructions related to the operation of the apparatus 100.

In one embodiment, the charger controller 112 may determine the remaining charge in a battery in response to a user inserting the battery into the battery slot 104. The charger controller 112 may determine the remaining charge in a device in response to a user inserting a device or device cable into a charging port 114. The charger controller 112 may determine the battery's remaining charge from the charging connector 202 or the data connector 204. The charger controller 112 may determine the device's remaining charge. In response to determining the battery or device's remaining charge, the charger controller 112 may distribute power to the battery or device.

Figure 3:
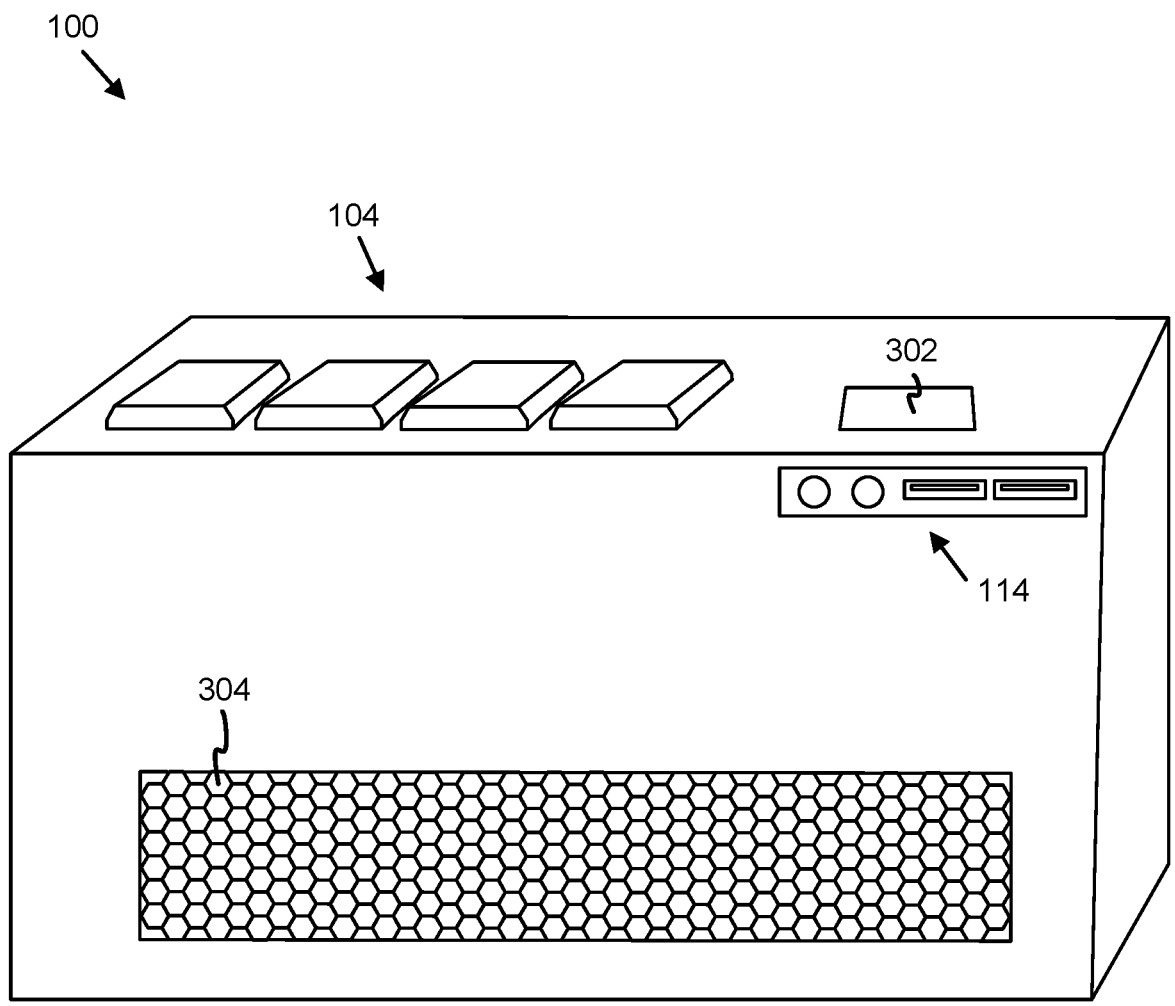
FIG. 3 is a perspective view illustrating another embodiment of a battery charging and cooling apparatus.

FIG. 3 depicts one embodiment of the apparatus 100. In one embodiment, the apparatus 100 may include a user interface 302. The user interface 302 may include a user interface disposed on the apparatus 100. In one embodiment, the user interface 302 may include a user interface external to the apparatus 100. The external user interface may be in data communication with the apparatus 100. For example, in one embodiment, the user interface 302 may include a computing device, such as a laptop, desktop computer, tablet, smart phone, or the like. The user interface 302 may be in data communication with the apparatus 100. For example, the user interface 302 may be in data communication with the apparatus 100 through the data input/output interface of the charger controller 112.

In one embodiment, the user interface 302 may include a screen. The screen may display information about the apparatus 100 to the user. The screen may display a status of the power distribution to one or more portions of the apparatus 100. For example, the screen may display an amount of power consumed by each portion of the apparatus 100, a percentage of power consumed by each portion of the apparatus 100, or the like. The screen may display the temperature of the cooling chamber 102, one or more batteries, the cooler 106, or the like. The screen may display an amount of unused power (if any). The screen may display a power distribution order, program, routine, or the like as described below. The user may input instructions, commands, parameters, configurations, or the like via the user interface 302. The user interface 302 may include one or more buttons, scroll wheels, lights, screens, or the like that a user may use to interact with the apparatus 100 and/or input instructions, parameters, or the like into the apparatus 100. In one embodiment, the screen may include a touchscreen. The user may interact with the touchscreen to input user input.

In one embodiment, a user may configure the power distribution of the charger controller 112. The user may configure the power distribution in a variety of ways. In one embodiment, the user may input an amount of power for the charger controller 112 to distribute to one or more portions of the apparatus 100. For example, the user may input a configuration that includes the charger controller 112 distributing 300 watts to one battery slot 104, 300 watts to another battery slot 104, and 600 watts to the cooler 106. In one embodiment, the user may input one or more percentages of the total available power that one or more portions of the apparatus 100 receive from the power source 108. For example, the user input a configuration that includes the charger controller 112 distributing 5% of the total available power to a USB port, 20% to a battery slot 104, and 45% to the cooler 106.

In some embodiments, a user may input an invalid power distribution configuration. An invalid power distribution configuration may include a configuration that distributes more power than the total available power, a percentage configuration with a total above 100%, or the like. In response to the user inputting an invalid power distribution configuration, the charger controller 112 may not allow the user to input one or more parts of the configuration. The charger controller 112 may display an error to the user in response to an invalid power distribution configuration.

In one embodiment, the apparatus 100 may include an air escape 304. The air escape 304 may include an aperture. The aperture may allow heated air or the like to escape from the interior of the apparatus 100. The air escape 304 may include a grate or the like over the aperture. The grate may prevent debris or the like from entering the interior of the apparatus 100. The grate may provide structural support to the aperture. The air escape 304 may include a variety of sizes and shapes. For example, the air escape 304 may include a circular, rectangular, or the like shape.

In one embodiment, the air escape 304 may be disposed proximal to the power source 108. In one embodiment, the air escape 304 may be disposed proximal to the cooler 106. In one embodiment, the air escape 304 may be disposed proximal to the charger controller 112. In some embodiments, the apparatus 100 may include multiple air escapes 304.

As shown in FIG. 3, the charging port 114 may be disposed on an exterior of the apparatus 100. The charging port 114 may be disposed proximal to the user interface 302, the charger controller 112, or the like. In one embodiment, the charging port 114 may include multiple charging ports 114 or may include multiple types of charging ports 114. The same types of charging ports 114 may be disposed proximal to each other. The groups of charging ports 114 may be disposed in different locations on the apparatus 100.

Figure 4:
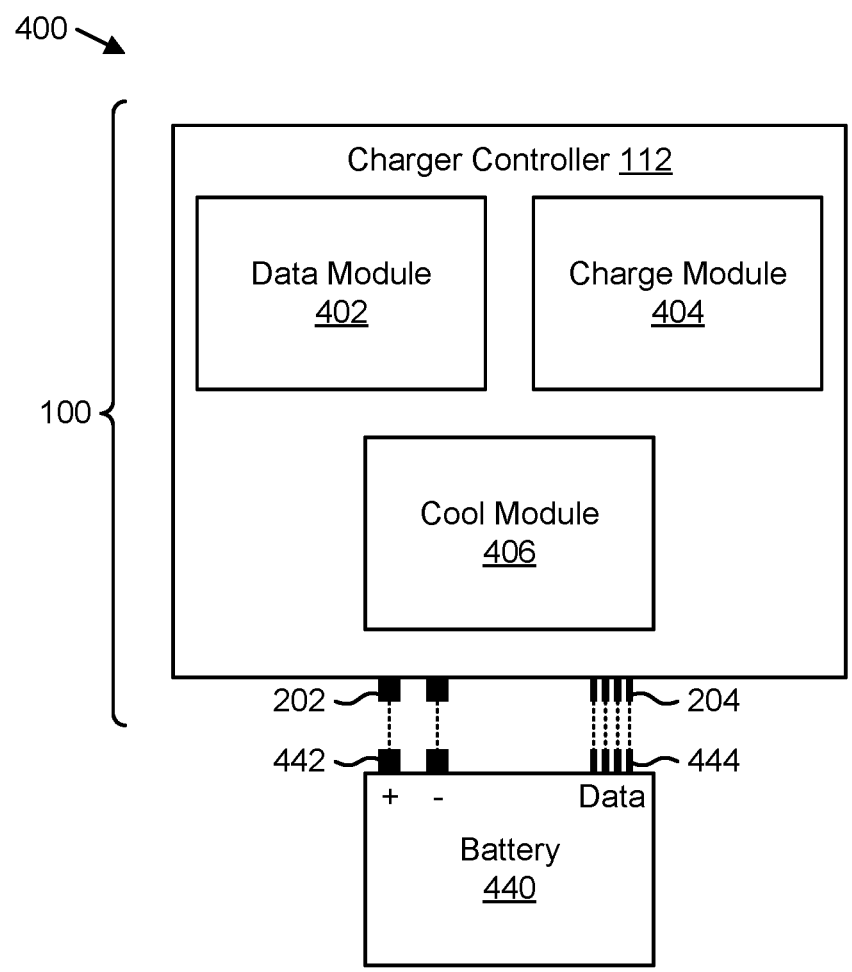
FIG. 4 is a schematic block diagram illustrating one embodiment of a battery charging system.

FIG. 4 depicts one embodiment of a battery charging system 400. The system 400, in the depicted embodiment, includes a battery 440, and a charging apparatus 100, which may be substantially as described above. In the depicted embodiment, the battery 440 includes power terminals 442 and data terminals 444. In the depicted embodiment, the charging apparatus 100 includes a charger controller 112, a charging connector 202 and a data connector 204, which may be substantially as described above. In the depicted embodiment, the charger controller 112 includes a data module 402, a charge module 404 and a cool module 406.

The battery 440, in certain embodiments, is configured to provide power to an electrical device. An electrical device may refer to any device powered by electricity, such as a drone, a power tool, or the like. For example, a battery 440 may include a drone battery, a power tool battery, or another battery. In further embodiments, the battery 440 may be removable from the electrical device for charging, and the charging apparatus 100 may be separate from the electrical device powered by the battery 440, so that the battery 440 is coupled to the electrical device for use, removed from the electrical device after use, and coupled to the charging apparatus 100 for charging. For example, in one embodiment, the battery 440 may be a DJI-brand TB47 or TB48 battery. The battery 440 may include a lithium-ion battery, a lithium-polymer battery, or another rechargeable battery 440. The battery 440, in certain embodiments, may include a plurality of electrochemical cells connected in series, in parallel, in multiple series strings with the series strings connected in parallel, or the like. Various configurations of cells for a battery 440 will be clear in view of this disclosure. Additionally, in certain embodiments, a battery 440 may include a single cell, and may still be referred to herein as a "battery."

The battery 440, in certain embodiments, includes a set of power terminals 442. In the depicted embodiment, power terminals 442 include a positive terminal and a negative terminal. In various embodiments, the battery 440 may provide power via the power terminals 442 when in use. For example, a voltage across the power terminals 442, provided by the battery 440, may cause a current from the positive power terminal 442, through the electrical device powered by the battery 440, to the negative power terminal 442.

The battery 440, in certain embodiments, includes a set of data terminals 444. A set of data terminals 444, in various embodiments, may include one or more data terminals 444 configured to communicate data (e.g., signals representing data values) between the battery 440 and another device, such as an electrical device powered by the battery 440 or a charging apparatus 100. For example, in one embodiment, data terminals 444 may be used to communicate data from the battery 440 to the charging apparatus 100. In a certain embodiment, data terminals 444 may be used to communicate data from the charging apparatus 100 to the battery 440. Battery data communicated by the set of data terminals 444 may include any information about the battery 440, including information about a current state of the battery 440 (e.g., current voltage, per-cell voltage, temperature, or the like), information about past history of the battery 440 (e.g., a charge cycle count, safety alert flags, or the like), information identifying the battery 440 such as a serial number or other identifier, or the like. In certain embodiments, a battery 440 may include diagnostic or management circuitry that monitors, stores or obtains battery data, and that communicates battery data via the data terminals 444. For example, in one embodiment, a battery 440 may include a "battery gas gauge" or "battery fuel gauge" chip available from Texas Instruments, Inc., which communicates battery data via the data terminals 444. Various other or further types of battery data, and/or of diagnostic or management circuitry that communicates battery data via data terminals 444, will be clear in view of this disclosure.

In various embodiments, the power terminals 442 and data terminals 444 may include electrical conductors such as pin conductors, spade conductors, post conductors, pad conductors, a plug, a socket, a pin header, a Japan Solderless Terminal (JST) connector, or the like. In certain embodiments, the set of data terminals 444 may be separate from the set of power terminals 442, and may include one or more conductors that are not conductors of the power terminals 442. In one embodiment, the data terminals 444 may be a set of conductors independent of the power terminals 442. In another embodiment, the data terminals 444 may include one or more shared conductors with the power terminals 442. For example, in one embodiment, the negative power terminal 442 may also function as a ground for the data terminals 444.

The charging apparatus 100, in various embodiments, may be substantially similar to the apparatus 100 described above with reference to FIG. 1, FIG. 2, and FIG. 3. In the depicted embodiment, the charger controller 112 includes a data module 402, a charge module 404 and a cool module 406, and the charging apparatus 100 may be a charging and cooling apparatus 100 as described above, with the charging connector 202 and the data connector 204 provided by a battery slot 104 at least partially cooled by a cooling chamber 102, as described above. In another embodiment, a charger controller 112 may include a data module 402 and a charge module 404, but may omit the cool module 406, and the charging apparatus 100 may be a charging apparatus 100 without cooling. For example, the charging connector 202 and the data connector 204 may be connectors that are not associated with a cooled battery slot 104. However, in certain embodiments, cooling a battery 440 prior to and/or during charging may facilitate faster charging than charging an un-cooled battery 440, and may avoid overheating damage, safety problems, or the like.

The charging connector 202, in certain embodiments, is configured to connect to power terminals 442 of a battery 440. A charging connector 202 may include a set of electrical conductors configured to engage with or contact the electrical conductors of the power terminals 442. For example, in one embodiment, the power terminals 442 of a battery 440 may be provided in a socket connector, and the charging connector 202 may include tabs, blades, spades, pins, a plug, or the like, which may be shaped, sized, or otherwise configured to engage the socket connector. In another embodiment, the power terminals 442 of a battery 440 may include pad conductors, and the charging connector 202 may include leaf spring contacts, or the like, that engage the pads. In another embodiment, the power terminals 442 of a battery 440 may include a plug, pins, or the like, and the charging connector 202 may include a socket shaped, sized, or otherwise configured to receive the plug or pins. In various embodiments, the power terminals 442 and/or the charging connector 202 may be disposed at the end of a flexible cable. In another embodiment, the power terminals 442 and/or the charging connector 202 may be rigidly coupled to the battery 440 or the charging apparatus 100, respectively. Various other or further ways to configure a charging connector 202 to engage power terminals 442 of a battery 440 will be clear in view of this disclosure.

The data connector 204, in certain embodiments, is configured to connect to data terminals 444 of a battery 440. A data connector 204 may include a set of electrical conductors configured to engage with or contact the electrical conductors of the data terminals 444. For example, in one embodiment, the data terminals 444 of a battery 440 may be provided in a socket connector, and the data connector 204 may include tabs, blades, spades, pins, a plug, or the like, which may be shaped, sized, or otherwise configured to engage the socket connector. In another embodiment, the data terminals 444 of a battery 440 may include pad conductors, and the data connector 204 may include leaf spring contacts, or the like, that engage the pads. In another embodiment, the data terminals 444 of a battery 440 may include a plug, pins, or the like, and the data connector 204 may include a socket shaped, sized, or otherwise configured to receive the plug or pins. In various embodiments, the data terminals 444 and/or the data connector 204 may be disposed at the end of a flexible cable. In another embodiment, the data terminals 444 and/or the data connector 204 may be rigidly coupled to the battery 440 or the charging apparatus 100, respectively. Various other or further ways to configure a data connector 204 to engage data terminals 444 of a battery 440 will be clear in view of this disclosure.

The data connector 204, in certain embodiments, includes one or more electrical conductors distinct from electrical conductors of the charging connector 202. For example, as described above, the data terminals 444 of a battery 440 may include at least one conductor other than a power terminal 442, and may be a set of conductors independent of the power terminals 442, or a set of conductors that shares one or more conductors with the power terminals 442, such as a shared ground, but that still includes at least one data conductor that is not a power terminal 442. Similarly, the data connector 204 of the charging apparatus 100 may include at least one conductor other than a conductor of the charging connector 202, and may be a set of conductors independent of the charging connector 202, or a set of conductors that shares one or more conductors with the charging connector 202, such as a shared ground, but that still includes at least one data conductor that is not a conductor of the charging connector 202.

In certain embodiments, the charger controller 112, as described above, may direct or apportion power between components of the apparatus 100, such as between one or more battery slots 104 for charging, and a cooler 106 for cooling one or more batteries 440. In one embodiment, the charger controller 112 may include voltage and/or current controlling circuitry, such as one or more power transistors, rectifiers, voltage regulators, power-smoothing capacitors, fuses, fuses, resettable fuses (e.g., positive temperature coefficient devices). In further embodiments, the charger controller 112 may include logic circuitry such as logic chips, transistors, or other discrete components, a field programmable gate array, and application specific integrated circuit, a processor executing code stored on a computer readable medium, or the like. The data module 402, charge module 404, and cool module 406 may similarly include power control circuitry, logic components, a processor executing code, or the like. Various other or further components of a charger controller 112, a data module 402, a charge module 404, and/or a cool module 406 will be clear in view of this disclosure.

In general, in various embodiments, the charger controller 112 is configured to read battery data from a battery 440, and to charge the battery 440 by supplying a power level based on the battery data. In certain embodiments, the charger controller 112 is configured to operate the cooler 106 to cool the battery 440 or to control the temperature of the battery 440. In further embodiments the charger controller 112 may control charging and/or cooling based on the battery data. In general, in various embodiments, controlling charging and/or cooling based on battery data read from a battery 440 may provide faster charging, more power-efficient charging, and/or greater battery lifetime, as compared to chargers that do not charge or cool a battery 440 based on reading data from the battery 440.

The data module 402, in one embodiment, is configured to read battery data from the battery 440 via the data connector 204. Reading data, in various embodiments, may include any way of obtaining battery data from the battery 440 via the data connector 204, such as sending a command to diagnostic or management circuitry via the data terminals 444, receiving a signal that represents battery data over the data terminals 444, or the like. Various ways to read data from various types of batteries 440 will be clear in view of this disclosure.

Battery data that the data module 402 reads from the battery 440 may include any information about the battery 440, such as any information provided by battery diagnostic or management circuitry via the data terminals 444. In one embodiment, battery data may include a charge cycle count for the battery 440. In certain embodiments, a charge cycle may refer to an amount of battery charging equivalent to a predetermined or user-set percentage or amount. For example, a charge cycle may be an amount of charging equivalent to a charge from 0% to 90%, and may be a single charge from 0% to 90%, a single charge from 5% to 95%, two charges from 45% to 90% or the like. A charge cycle based on 90% is provided for illustrative purposes and is not intended as limiting. A charge cycle, in another embodiment, may be equivalent to a charge from 0% to a percentage other than 90%, from a voltage corresponding to a discharged state to a voltage corresponding to a charged state, or the like. A charge cycle count may be a count or other measurement corresponding to a number of charge cycles for the battery 440 over the lifetime of the battery 440, since a predetermined reference point, or the like. In a certain embodiment, battery data may include a battery identifier such as a serial number, a universally unique identifier (UUID), or other data that identifies the battery 440 or distinguishes it from other batteries 440.

In some embodiments, battery data that the data module 402 reads from the battery 440 may include temperature data, such as a battery temperature, a temperature per cell, a peak temperature since the last charge, a set of one or more past temperatures, or the like. In certain embodiments, battery data may include past and/or present electrical measurements, such as a battery current (e.g., past or present electrical current being delivered by the battery 440), a current per cell (e.g., for parallel cells or strings of cells), a battery voltage (e.g., past or present voltage across the power terminals 442 of the battery 440, including an open-circuit voltage or a voltage across a load), a voltage per cell (e.g., voltages across individual cells in series between the power terminals 442), a past or present wattage delivered by the battery 440, a measurement of amp-hours delivered by the battery 440 since a reference point such as the last charge, or the like. In various embodiments, battery data may include a state-of-charge (SOC) percentage, which may represent a ratio of battery charge to battery capacity, an amount of charge deliverable by the battery 440 compared to an amount of charge deliverable by a fully charged battery 440, or the like, and which may be based on a comparison of a present open-circuit voltage to a fully charge open-circuit voltage, an integration of charge and discharge current over time, or the like. Various ways to determine a state-of-charge percentage will be clear in view of this disclosure.

In one embodiment, battery data that the data module 402 reads from the battery 440 may include one or more safety alert flags, or other flags. A flag may be information set or stored by battery diagnostic or management circuitry. In certain embodiments, a flag may indicate that an event has occurred. In further embodiments, a flag may include a timestamp, charge cycle number or other information about when the event occurred in relation to some reference point; e.g., whether an event occurred since the last charge cycle, whether an event represented by a first flag occurred before or after an event represented by a second flag, or the like. Safety alert flags may record events involving battery safety such as overvoltage conditions, overcurrent conditions (e.g., a short circuit across the power terminals 442, a short-circuited cell, or the like), over-temperature conditions, low-temperature conditions, cell failure, or the like. In certain embodiments, flags may indicate that an event has not occurred. For example, an overvoltage flag may be set to a first value indicating that an overvoltage condition has not occurred, or to a second value indicating that an overvoltage condition has occurred. Various types of safety alert flags or other flags, or other or further battery data that may be read by the data module 402 will be clear in view of this disclosure.

In certain embodiments, the data module 402 may read initial data from the battery 440. Initial data may refer to a first set of data obtained in response to connecting the battery 440 to the charging apparatus 100. For example, initial data may be obtained by the data module 402 when the battery 440 is connected to the charging apparatus 100, prior to charging, in response to charging being initiated, or the like. In further embodiments, the data module 402 may read additional data from the battery 440. Additional data may refer to a second set of data (e.g., other than the initial data) obtained by the data module 402. In various embodiments, the data module 402 may obtain additional data while the battery 440 is charging, after charging is complete but while the battery 440 remains connected to the charging apparatus 100, prior to charging but after obtaining the initial data, or the like.

In certain embodiments, initial data may reflect or indicate battery conditions during use of the battery 440 in a device. For example, if the data module 402 reads an overtemperature flag with the initial data, the battery 440 may have experienced an overtemperature condition during use. However, in certain embodiments, flags or data may record the last occurrence of an event. For example, if the battery 440 experienced overtemperature conditions five times during use, the overtemperature flag may be overwritten each time, and may only indicate the most recent overtemperature event. Thus, in certain embodiments, initial data may not fully reflect battery safety or other battery conditions. However, in further embodiments, the data module 402 may continuously or periodically (e.g., at regular intervals) sample or read additional battery data while the battery 440 is connected to the charging apparatus 100. For example, if an overtemperature condition occurs five times during charging, the overtemperature flag may be overwritten each time, but may be read and stored by the data module 402 multiple times, so that more than one of the overtemperature events are detected and recorded by the data module 402. In certain embodiments, using a data module 402 to obtain initial data and additional data may facilitate analysis of a battery condition, determining a remaining lifetime for the battery 440, determining to retire a battery 440, determining parameters for charging the battery 440, or the like.

In certain embodiments, the data module 402 may store the battery data, such as initial data and/or additional data. In further embodiments, the data module 402 may include or be in communication with data storage hardware, such as non-volatile memory, a magnetic storage drive, an internet-based storage device, or the like. In certain embodiments, the data module 402 may store battery data in association with an identifier for a battery 440. For example, in certain embodiments, a charging apparatus 100 may be used to repeatedly recharge a battery 440 after multiple uses, and the data module 402 may gather initial and/or additional data multiple times for multiple charge cycles, and may store the data with the battery serial number or other identifier in a database or other data structure, to create a history of battery data for that battery 440. In some embodiments, a charging apparatus 100 may be used to charge multiple different batteries 440, and may maintain a database of battery data for multiple batteries 440. In certain embodiments, the data module 402 may provide a user with access to the stored data. For example, the data module 402 may include or be in communication with the user interface 302 described above with reference to FIG. 3, and a user may access battery data, or information about battery data (such as predictions or analysis based on the battery data) via the user interface 302.

In one embodiment, the data module 402 may provide a user with a predicted remaining lifetime for a battery 440 based on the battery data. A predicted remaining lifetime may include a time to retirement, to capacity being diminished by a predetermined amount or the like, and may include a time, a number of remaining charge cycles, or the like. In certain embodiments, a battery 440 may be rated for a lifetime including a number of charge cycles specified by a manufacturer. In one embodiment, the data module 402 may provide a predicted remaining lifetime based on a number of elapsed charge cycles. In a certain embodiment, however, the data module 402 may predict a remaining lifetime based wholly or at least in part on battery data other than a charge cycle count. For example, the data module 402 may predict remaining battery lifetime based on how often it detects certain safety alert flags in the initial and/or additional data. Various other or further ways of predicting a remaining lifetime for a battery 440 will be clear in view of this disclosure.

In one embodiment, the data module 402 may retire a battery 440 from use based on the battery data. For example, in response to detecting too-frequent safety alert flags, or other conditions affecting battery safety or usability, the data module 402 may retire a battery 440 from use by informing the user (e.g., via the user interface 302) that the battery 440 should be retired, communicating with the charge module 404 to instruct the charge module 404 not to charge the battery 440, requiring a user to acknowledge a safety risk and/or override a safety protocol prior to charging the battery 440, or the like.

The charge module 404, in certain embodiments, is configured to charge a battery 440, by supplying a power level to the battery 440 via the charging connector 202. In further embodiments, the charge module 404 may supply a power level that is based on the battery data read and/or stored by the data module 402. In various embodiments, supplying a power level based on the battery data may include supplying and/or adjusting a voltage, current, wattage, or the like, based on the battery data. Any adjustment to a parameter such as voltage or current, that affects the amount of power delivered to the battery 440, may be referred to herein as supplying a power level that is based on the battery data.

In various embodiments, charge parameters such as voltage, current, power, or the like may be varied or set by the charge module 404 based on battery data such as battery voltage, battery current, voltage and/or current per cell, battery temperature, battery state-of-charge, safety alert flags or the like. For example, in one embodiment, the battery data may include a battery temperature, and the charge module 404 may increase the power level supplied to the battery 440 and decrease the power level supplied to the cooler 106 in response to a low temperature, decrease the power level supplied to the battery 440 and increase the power level supplied to the cooler 106 in response to a high temperature, or the like. In another embodiment, the battery data may include a battery current or a voltage per cell, and the charge module 404 may increase or decrease the power level supplied to the battery 440 based on a target battery current, increase or decrease the applied voltage based on a target voltage per cell or a per-cell voltage limit, or the like. Various other or further ways of basing a supplied power level on battery data will be clear in view of this disclosure.

In one embodiment, the charge module 404 may supply a power level based on battery data by ramping up an applied voltage based on battery data. For example, in one embodiment, a battery 440 may have a nominal voltage of 26.0 volts, which may be a target voltage for charging the battery 440, but the battery 440 may be discharged to an open-circuit voltage of 22.0 volts. Applying 26.0 volts across the power terminals 442 of the battery 440 may result in more current when the battery 440 is discharged to a low voltage, but in less current when the battery 440 charges back to a higher voltage or more. Thus, in one embodiment, the charge module 404 may ramp up an applied voltage by increasing the voltage across the power terminals 442 over time based on battery data such as a current, voltage per cell, or the like, and may increase the voltage over time based on a target current, a target voltage per cell, a current limit, a per-cell voltage limit, or the like.

In a certain embodiment, the charge module 404 may supply a power level based on battery data by iteratively applying and removing an over-target voltage to the battery 440, until a completion threshold is satisfied. In various embodiments, the charge module 404 may determine when to apply the over-target voltage, when to remove the over-target voltage, and/or the value of the over-target voltage, based on the battery data read by the data module 402. A target voltage, in various embodiments may refer to a predetermined or user-determined voltage to which a battery 440 is to be charged. In one embodiment, a target voltage may be a nominal voltage for the battery 440, such as 3 V for a 3 V battery, 26.1 V for a 26.1 volt battery. In another embodiment a target voltage may be a voltage other than a nominal voltage for the battery 440. For example, in one embodiment, a target voltage for an older or heavily used battery 440 may be lower than the nominal voltage for the battery 440. In certain embodiments, the target voltage may be predetermined or set by a user. In another embodiment, a target voltage may be determined by the charge module 404 based on the battery data.

An over-target voltage, in various embodiments, may be a voltage greater than the target voltage. For example, an over-target voltage may be the target voltage plus 1 V, plus 0.5 V, plus 1.5 V, or the like. In certain embodiments, applying an over-target voltage when charging may increase current into the battery 440, resulting in faster charging. However, applying an over-target voltage may also result in overheating, battery damage, or the like. In certain embodiments, the charge module 404 may gradually ramp up the applied voltage based on the battery data as described above until reaching the over-target voltage. In another embodiment, the charge module 404 may determine to apply the over-target voltage based on battery data such a current, voltage, and or temperature data, and may step up the applied voltage to the over target voltage.

In further embodiments, the charge module 404 may supply the over-target voltage until a condition is satisfied, such as the battery heating past a threshold temperature, or charging to a voltage past the target voltage or another threshold voltage. Based on battery data indicating that the condition is satisfied (e.g., voltage data, current data indicating the voltage, temperature data, or the like), the charge module 404 may remove the over-target voltage, and may instead supply the target voltage, or may open a charging circuit allowing the power terminals 442 to float. With the over-target voltage removed, the battery voltage may settle as internal chemical reactions occur, and may fall below the target voltage or another voltage threshold. Based on battery data indicating that voltage threshold or other target is no longer satisfied (e.g., voltage data, current data indicating the voltage, temperature data, or the like), the charge module 404 may reapply the over-target voltage.

In certain embodiments, the charge module 404 may determine or adjust the value of the over-target voltage based on the battery data. For example, the charge module 404 may set or adjust the over-target voltage based on battery current, battery safety flags, or the like. In various embodiments, the charge module 404 may iteratively apply and remove the over-target voltage based on the battery data, until a completion threshold is satisfied. A completion threshold may be a voltage, voltage range, state-of-charge, or other condition indicating that charging is complete. For example, in one embodiment, a completion threshold may be satisfied if the battery voltage remains within a predetermined margin of the target voltage, within a predetermined time period after removing the over-target voltage. In another embodiment, a completion threshold may be satisfied based on integrating the current into the battery 440 over time. Various other or further completion thresholds for charging a battery 440 will be clear in view of this disclosure.

In certain embodiment the charge module 404 may set, adjust, or otherwise determine a completion threshold based on the battery data read by the data module 402, and may charge the battery 440 until the completion threshold is satisfied. For example, in one embodiment, the charge module 404 may increase the completion threshold to a higher voltage, a greater state-of-charge percentage, or the like, to attempt overcharging a new battery 440 or other battery 440 where the battery data indicates that overcharging is likely to be safe. In another embodiment, the charge module 404 may decrease the completion threshold to a lower voltage, a lower state-of-charge percentage, or the like, to undercharge a battery 440 where the battery data indicates that the battery 440 is older, heavily used, or less able to hold a full charge. For example, in one embodiment, voltage per cell or other battery data read by the data module 402 may indicate that one cell has a high self-discharge rate when fully charged, or is otherwise less capable than other cells of holding a full charge, and the charge module 404 may adjust the completion threshold to charge the battery 440 to less-than-full capacity in response.

The charge module 404, in a further embodiment, may perform a deep cycle discharge of the battery 440 based on the battery data read by the data module 402. In certain embodiments, a deep cycle discharge may include a discharge above a threshold discharge percentage, below a threshold state-of-charge-percentage, below a threshold open-circuit voltage, or the like. A deep cycle discharge may, in certain embodiments increase battery capacity and/or life, but may itself cause wear. A threshold for deep-cycle discharging may be predetermined, set by a user, set by the charge module 404 based on battery data, or the like. In certain embodiments, the charge module 404 may determine, based on the battery data, whether to perform a deep cycle discharge. In further embodiments, in response to determining to perform a deep cycle discharge, the charge module 404 may perform the deep cycle discharge, discharging the battery 440 across a resistive load and dissipating the heat from the discharge in a heat sink, or otherwise removing heat as described above with reference to the cooling chamber 102. The charge module 404 may perform the deep cycle discharge prior to charging the battery 440.

In certain embodiments, a deep cycle discharge may be based on charge cycle counts. For example, a charge module 404 may be configured to perform a deep cycle discharge every five charge cycles, every ten charge cycles, every twenty charge cycles for the battery 440, or the like. However, performing a deep cycle discharge at regular intervals or cycle counts for the battery 440 may result in too-frequent or too-infrequent discharging, causing over-wear or other battery health problems. Accordingly, in certain embodiments, the charge module 404 may perform a deep cycle discharge based wholly or at least in part on battery data other than a charge cycle count. For example, the charge module 404 may perform a deep cycle discharge earlier than scheduled in response to battery data indicating a battery health issue that may be improved by a deep cycle discharge, or may perform a deep cycle discharge later than scheduled in response to battery data indicating that a deep cycle discharge is not likely to significantly improve battery health. For example, in one embodiment, a charge module 404 may perform a deep cycle discharge based on battery data including an open-circuit voltage for the battery 440 and a state-of-charge percentage, if the state-of-charge percentage is inconsistent with the open-circuit voltage. In one embodiment, the charge module 404 may determine whether to perform a deep cycle discharge by using the battery data to predict whether the likely benefits of a deep cycle discharge exceed a threshold based on the wear or other detriments of a deep cycle discharge.

The cool module 406, in certain embodiments, is configured to operate the cooler 106 to control a temperature of the battery 440. Controlling a temperature of the battery 440 may include cooling the battery 440 prior to charging, maintaining a battery temperature during charging, cooling the battery 440 below a threshold temperature, maintaining a battery temperature in a range defined by an upper temperature threshold and a lower temperature threshold, or the like. In certain embodiment, the cool module 406 may cool the battery 440 based on battery data read by the data module 402. For example, in certain embodiment, the cool module 406 may cool the battery 440 based directly on temperature data, or based on current data, voltage data, safety flag data, or the like. The cool module 406 may operate the cooler 106 by turning the cooler 106 on or off, controlling a power level supplied to the cooler 106, or the like. Various ways to operate a cooler 106 are describe above with regard to FIGS. 1-3.

Figure 5:
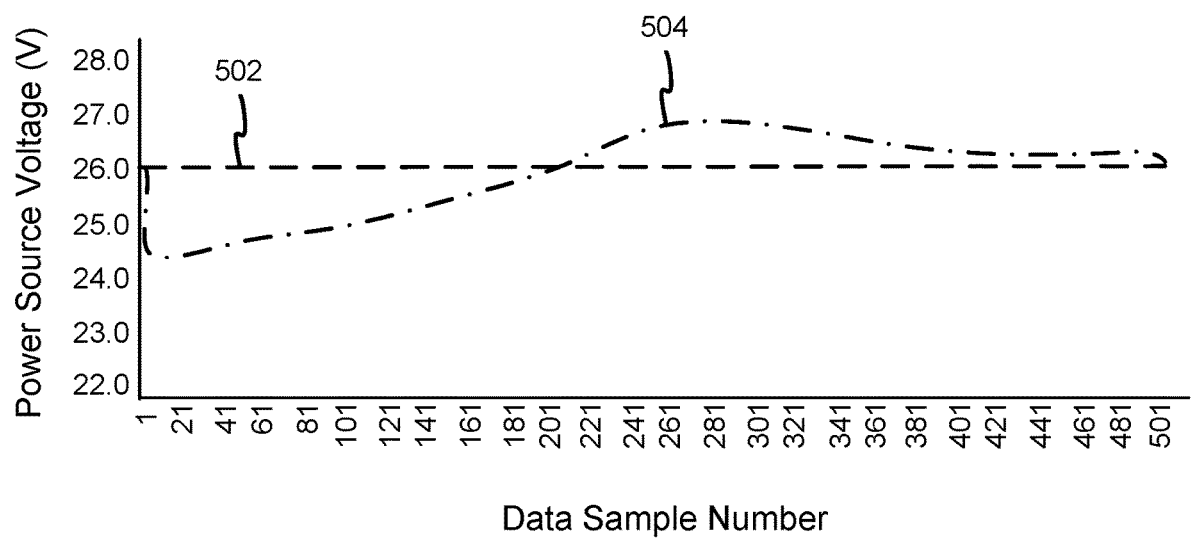
FIG. 5 is a graph illustrating one embodiment of a charging voltage over time.

FIG. 5 depicts a graph of charging voltages over time for a battery 440, in one embodiment. In certain embodiments, the charger controller 112 may include one or more charge thresholds. A charge threshold may include a target voltage 502. In one embodiment, the charger controller 112 may direct power to a battery 440 in the battery slot 104 above a target voltage 502. For example, the target voltage 502 may include the voltage at which other battery chargers charge the battery 440. In some embodiments, the battery 440 may heat up to an unsafe temperature or overheat in response to charging the battery 440 above the target voltage 502. For example, in one embodiment, as depicted in FIG. 5, the target voltage 502 may include 26.0 V. The target voltage 502 may remain constant during charging in other chargers.

In one embodiment, the charger controller 112 may direct power to the battery 440 at a voltage 504 under the target voltage 502 for a period of time. For example, as depicted in FIG. 5, the power source 108 may supply power to the battery 440 under the target voltage 502 from data sample 1 to data sample 221. In some embodiments, the charger controller 112 may direct power to the battery 440 at a voltage 504 above the target voltage 502. For example, the power source 108 may supply power to the battery 440 above the target voltage 502 from data sample 221 to data sample 501. The voltage 504 may peak at a voltage above the target voltage 502. For example, as depicted in FIG. 5, the voltage 504 may peak around 27.0 V at about data sample 270. In one embodiment, in response to the battery 440 being almost fully charged, the voltage 504 may reach the target voltage 502 as shown in FIG. 5.

In response to the battery 440 receiving power above a target voltage 502, the battery 440 may maintain a rate of charge. In some embodiments, in response to the battery 440 reaching a first predetermined charge and receiving power above a target voltage 502, the temperature of the battery 440 may reach a certain temperature. However, in response to the cooler 106 extracting heat from the cooling chamber 102, the temperature of the battery 440 may be maintained at a lower temperature. In one embodiment, in response to the battery 440 reaching a second predetermined charge, the charger controller 112 may reduce the power supplied to the battery 440 by the power source 108.

The voltages, such as the target voltage 502 and the voltage 504, the data sample numbers, and the voltages over time illustrated in FIG. 5 are for illustration purposes. The voltages, data sample numbers, and voltages over time may vary while still charging a battery 440 faster than other chargers.

The charger controller 112 may adjust the power flow to a battery 440 or device in response to the charge of the battery 440 or device reaching a threshold charge. For example, in one embodiment, in response to the battery 440 or device's charge reaching 90%, the charger controller 112 may reduce the rate of charge to the battery 440 or device. In one embodiment, in response to the battery 440 or device reaching a threshold charge, the charger controller 112 may stop charging the battery 440 or device. For example, in response to the battery 440 or device reaching a charge of 100%, the charger controller 112 may stop charging the battery 440 or device. In one embodiment, in response to the charger controller 112 reducing a rate of charge or stopping charge to a battery 440 or device, the unused available power may increase.

In one embodiment, the charger controller 112 may include one or more default charge thresholds. For example, in one embodiment, the default charge threshold to reduce a rate of charge for a battery 440 or device may be 90% and the default charge threshold to stop charging a battery 440 or device may be 100%. In one embodiment, a user may adjust one or more charge thresholds. For example, a user may set the charge threshold to reduce a rate of charge for a battery 440 or device at 80% and the charge threshold to stop charging a battery 440 or device at 95%. The above charge thresholds are examples and should not be read as limiting. A charge threshold may include a charge from 0% to 100%.

In one embodiment, the charger controller 112 may determine the temperature of a battery 440 in response to a user inserting the battery 440 into the battery slot 104. The charger controller 112 may determine the battery's temperature from the data connector 204. In response to the battery's temperature being above a threshold temperature, the charger controller 112 may distribute power to the cooler 106. In some embodiments, in response to battery's temperature decreasing, the charger controller 112 may distribute additional power to the battery slot 104 and charge the battery 440 at a faster rate. In one embodiment, in response to the battery's temperature decreasing and reaching a lower temperature than a temperature threshold, the charger controller 112 may distribute less power to the cooler 106.

In some embodiments, supplying additional power to the cooler 106 may decrease the temperature of the cooling chamber 102 or may decrease the temperature of the cooling chamber 102 at a faster rate. In one embodiment, supplying additional power to the cooler 106 may maintain a temperature of the cooling chamber 102 at a constant temperature. For example, inserting a hot battery 440 into the battery slot 104 may increase the temperature of the interior of the cooling chamber and supplying more power to the cooler 106 may prevent the temperature of the interior of the cooling chamber 102 from rising.

As described above, in certain embodiments, in response to a battery 440 or device reaching a threshold charge, the charger controller 112 may reduce the rate of charge or may stop charging that battery 440 or device. In some embodiments, in response to reaching a threshold temperature, the cooler 106 may reduce the rate of cooling or may deactivate. In response to reducing the rate of charge, ceasing charging a battery 440 or device, reducing the rate of cooling or deactivating the cooler 106, the unused power available to the apparatus 100 may increase. The charger controller 112 may automatically distribute power to one or more portions of the apparatus 100. For example, in response to the used power increasing, the charger controller 112 may automatically begin charging a device or battery 440, increase the rate of charging a device or battery 440, activate the cooler 106, or increase the rate of cooling in response to one of the unused power increasing.

In one embodiment, in response to the unused power increasing, the charger controller 112 may automatically distribute power to one or more portions of the apparatus 100 according to one or more user-configured parameters. In one embodiment, a user may configure the charger controller 112 to distribute power to one or more portions of the apparatus 100 in a certain order. For example, in one embodiment, the user may configure the charger controller 112 to: first, distribute power to the one or more devices connected via the USB port(s); second, distribute the remaining power (if any) to the one or more devices connected via the auxiliary port(s); third, distribute the remaining power (if any) to one or more batteries 440 inserted into one or more battery slots 104; and lastly, distribute the remaining power (if any) to the cooler 106. The preceding example is given as example only. A user-configured parameter may include a different order and may include fewer or more portions or components of the apparatus 100.

In some embodiments, in response to the unused power increasing, the charger controller 112 may automatically distribute power according to one or more default parameters. The default parameters may include one or more parameters included with the charger controller 112. The default parameters may include one or more parameters included with the charger controller 112 prior to a user providing user input.

In certain embodiments, in response to a user connecting a device via a charging port 114 or inserting a battery 440 into the battery slot 104, the charger controller 112 may automatically distribute power according to one or more user-configured parameters. In one embodiment, a user may configure the charger controller 112 to distribute power to one or more portions of the apparatus 100 in a certain order. For example, as described above, the user may configure the charger controller 112 to: first, distribute power to the cooler 106; second, distribute the remaining power (if any) to one or more batteries 440 inserted into one or more battery slots 104; and finally, distribute the remaining power (if any) to the one or more devices connected to one or more charging ports 114.

In one embodiment, the charger controller 112 may adjust the distribution of power in response to a user connecting a device to the apparatus 100 for charging or in response to a user inserting a battery 440 into the battery slot 104 for charging. For example, in response to a user plugging in a device to a USB port, the charger controller 112 may distribute power to the device. The charger controller 112 may distribute unused power or may decrease power supplied to one or more batteries 440 or devices or may decrease power supplied to the cooler 106 as described above.

For example, in one embodiment, the total available power may include 1200 watts. The charger controller 112 may include a battery charging threshold of 90%. In response to one battery 440 reaching 90% charge, the charger controller 112 may distribute 100 watts of power to that battery 440. The charger controller 112 may include a user-configured parameter specifying the order for charging devices or batteries 440 and powering the cooler 106. The order may include: (1) USB ports, (2) auxiliary ports, (3) batteries 440, and (4) cooler 106. The charger controller 112 may include a user-configured parameter specifying that the maximum power supplied to a battery 440 may be 200 watts. For example, the apparatus 100 may charge two batteries 440 in the battery slots 104 and the cooler 106 may be active. Charging a battery 440 may consume 200 watts (600 total) and the cooler 106 may consume 600 watts.

Continuing the example, a battery 440 may reach 90% charge. In response to the battery 440 reaching 90%, the charger controller 112 may distribute 100 watts to that battery 440. In response to distributing 100 watts to the battery 440, the unused power may increase from 0 watts to 100 watts. In response to the unused power increasing, the charger controller 112 may distribute the unused power to the cooler 106 (because there are not USB or auxiliary devices and all the batteries 440 are consuming their maximum power).

Continuing the example, a user may connect a USB device to a USB port of the apparatus 100. Charging the USB device may include the USB device consuming 15.5 watts. In response to the user connecting a USB device, the charger controller 112 may distribute power from the cooler 106 to the USB device.

In one embodiment, in response to a user inserting a battery 440 into a battery slot 104, a portion of the apparatus 100 may determine the temperature of the battery 440. In response to the temperature of the battery 440 being above a temperature threshold, the charger controller 112 may distribute power to the cooler 106. The charger controller 112 may distribute unused power or may decrease power supplied to one or more batteries 440 or devices as described above.

In one embodiment, a user-configured parameter may include a power amount specified by the user for a specified portion of the apparatus 100 (for example, the battery slot 104) or type of portion of the apparatus 100 (for example, all of the one or more battery slots 104). For example, the user may configure the charger controller 112 to distribute 100 additional watts to the cooler 106 in response to unused power increasing. The charger controller 112 may distribute 100 watts to the cooler 106 and may distribute remaining unused power (if any) to the next portion(s) of the apparatus 100 according to the one or more user-configured parameters.

Figure 6:
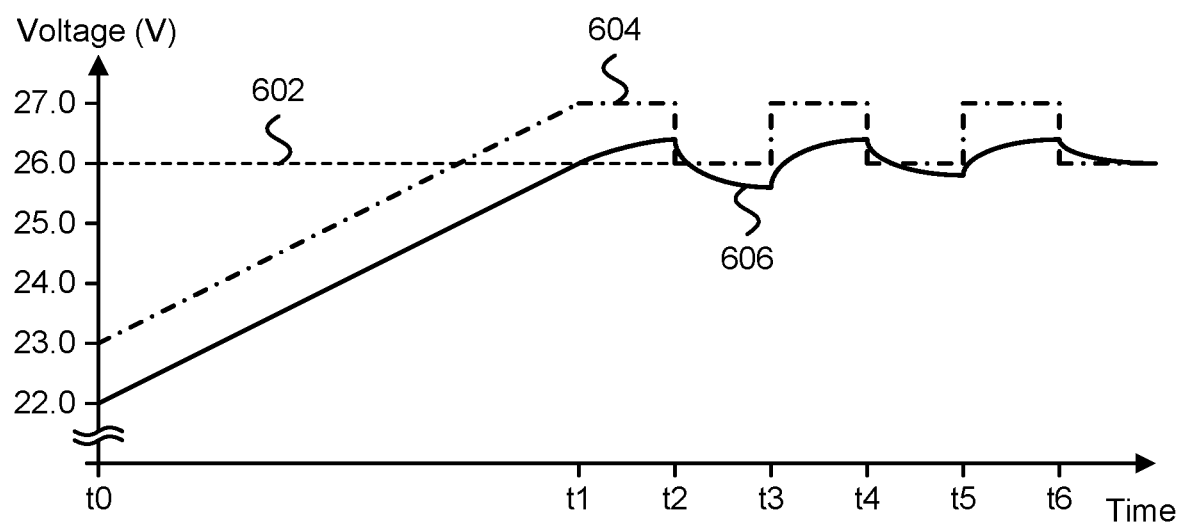
FIG. 6 is a graph illustrating another embodiment of a charging voltage over time.

FIG. 6 depicts a graph of charging voltages over time for a battery 440, in another embodiment. A target voltage 602, as described above with regard to FIG. 4 and FIG. 5, is indicated by a horizontal dashed line. An applied voltage 604 (e.g., applied across the battery power terminals 442 at the charging connector 202 by the charge module 404) is represented by a line of alternated dots and dashes. A battery voltage 606 (e.g., a measured open-circuit voltage measured by temporarily removing the applied voltage, a battery voltage inferred based on the applied voltage and the battery current read by the data module 402, or the like), is represented by a solid line.

In FIG. 6, time is represented as increasing along the horizontal axis. Times t0-t6 occur in order, but the scale may vary between events. For example, the voltage ramp between t0 and t1 may take more or less time than depicted, as may each interval of applied or removed over-voltage between t1 and t6. In the depicted embodiment, the charge module 404 ramps up the applied voltage 604 based on battery data. The battery data may include or indicate the battery voltage 606 and the charge module 404 may ramp up the applied voltage 604 to maintain a substantially uniform current, or a substantially uniform difference between the applied voltage 604 and the actual or inferred open-circuit battery voltage 606.

At time t1, the applied voltage 604 may have ramped up to an over-target voltage. For, example, in the depicted embodiment, the target voltage 602 is 26.0 V, and the over-target voltage is 27.0 volts. The charge module 404 may hold the applied voltage 604 at the over-target voltage, until the battery voltage 606 increases above the target voltage, as indicated by the battery data at time t2. The charge module 404 may then remove the over-target voltage, either by opening the charging circuit or by holding the applied voltage 604 at the target voltage, and the battery voltage 606 may fall. At time t3, the charge module 404 steps up the applied voltage 604 to the over-target voltage based on the battery data indicating that a completion threshold is not satisfied (e.g., the battery voltage 606 falling beyond a predetermined margin below the target voltage 602). The charge module 404 continues to apply and remove the over-target voltage until the completion threshold is satisfied.

Figure 7:
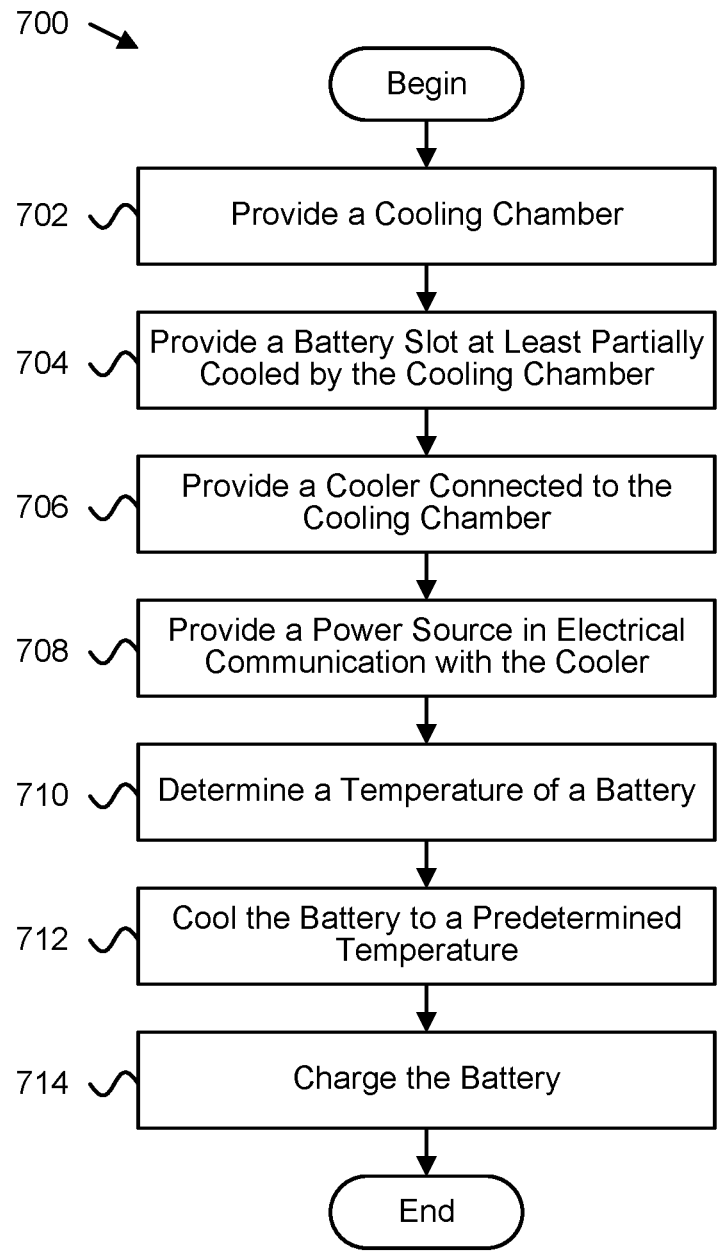
FIG. 7 is a flowchart diagram illustrating one embodiment of a method for battery charging.

FIG. 7 depicts one embodiment of a method 700 for battery charging. The method 700 may include providing 702 a cooling chamber 102. The method 700 may include providing 704 a battery slot 104 at least partially cooled by the cooling chamber 102. The method 700 may include providing 706 a cooler 106 connected to the cooling chamber 102. The method 700 may include providing 708 a power source 108 in electrical communication with the cooler 106. The method 700 may include determining 710 a temperature of a battery 440. The method 700 may include cooling 712 the battery 440 to a predetermined temperature. The method 700 may include, in response to the battery 440 reaching the predetermined temperature, charging 714 the battery 440.

In one embodiment, determining 710 the temperature of the battery 440 may include the data connector 204 of the battery slot 104 receiving temperature data from the battery 440 inserted into the battery slot 104, as described above. The data connector 204 may propagate the temperature data to the charger controller 112. In one embodiment, cooling 712 the battery 440 to a predetermined temperature may include the charger controller 112 directing power from the power source 108 to the cooler 106. The cooler 106 may cool the cooling chamber 102 or the battery 440 inserted into the battery slot 104 to a predetermined temperature, as described above. In one embodiment, charging 714 the battery 440 may include the charger controller 112 directing power from the power source 108 to the charging connector 202 of the battery slot. The charging connector 202 may propagate the charge to the battery 440, as described above.

In one embodiment, the method 700 may include discharging charge from the battery 440. The method 700 may include supplying power to the cooler 106 with the charge. In one embodiment, discharging charge from the battery 440 and supplying power to the cooler 106 with that charge may include the deep cycling described above. In one embodiment, the method 700 may include determining, from the battery 440, a number of times the battery 440 has been charged since discharging charge from the battery 440. Discharging charge from the battery 440 may include discharging charge from the battery 440 based on the number of times the battery 440 has been charged since discharging charge from the battery 440. As described above, the battery 440, the apparatus 100, or the like may store the number of times a battery 440 has been charged or the number of times a battery 440 has charged since it was last deep cycled.

In one embodiment, charging 714 the battery 440 may include supplying power to the battery 440 above a target battery voltage. Charging 714 the battery 440 may include, in response to the battery charge reaching a predetermined charge threshold, reducing the power supplied to the battery 440. For example, as described above, the power source 108 may supply power to the battery 440 above a target voltage of the battery 440. In response to reaching a predetermined charge threshold, the power source 108 may reduce the power supplied to the battery 440. This may allow the battery 440 to charge faster. The cooler 106 may cool the battery 440 to prevent the battery 440 from overheating, as described above.

In one embodiment, the method 700 may include maintaining the battery 440 at a second predetermined temperature in response to charging the battery 440. For example, as described above, in some embodiments, a battery 440 may be chargeable below a first temperature threshold, but may charge faster, more efficiently, or the like at a second temperature threshold. Maintaining the battery 440 at a second temperature threshold may include the cooler 106 cooling the cooling chamber 102 to that second temperature threshold.

In one embodiment, determining 710 the temperature of the battery 440 may include determining the temperature of each battery 440 of multiple batteries 440. As described above, the battery slot 104 may include multiple battery slots 104. Each battery 440 in the battery slots 104 may be at a different temperature and the data connector 204 of each battery slot 104 may determine the temperature of the battery 440 and propagate that temperature data to the charger controller 112. In one embodiment, charging the battery 440 may include supplying charge to each of the multiple batteries 440 based on the temperature of each battery 440. For example, in one embodiment, a first battery 440 may be below a threshold temperature and ready to receive a charge. A second battery 440 may be above the threshold temperature. In response, the charger controller 112 may direct power from the power source 108 to the first battery 440 (through the battery slot 104) but not to the second battery 440. The charger controller 112 may direct power to the second battery 440 in response to the battery 440 reaching the temperature threshold (for example, in response to the cooler 106 cooling the cooling chamber 102 and extracting heat from the battery 440). In some embodiments, the method 700 may include other steps, operations, actions, or the like described above in relation to the apparatus 100 or the like.

Figure 8:
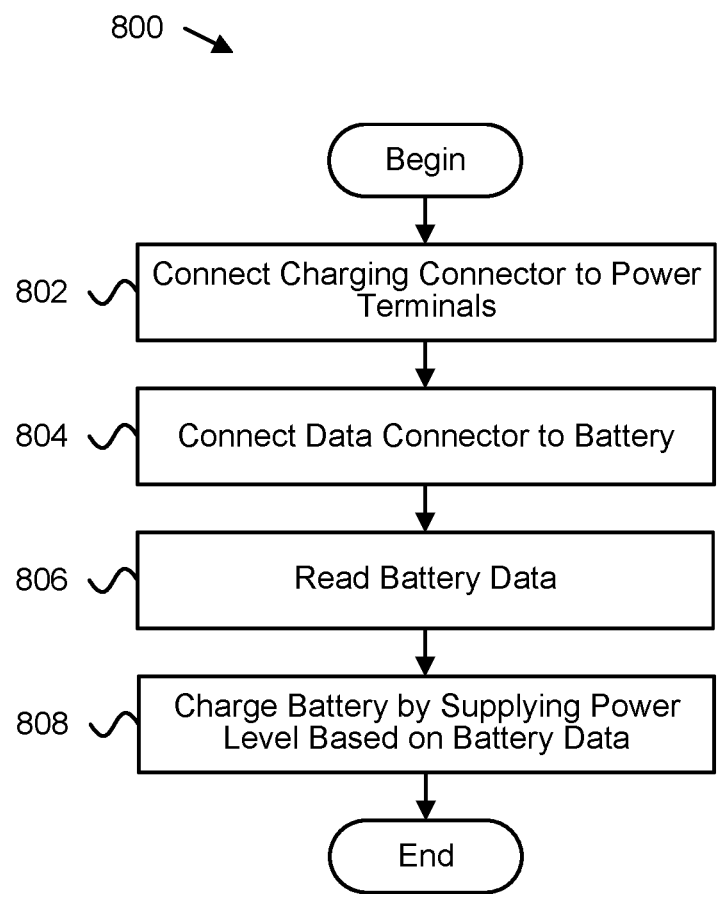
FIG. 8 is a flowchart diagram illustrating another embodiment of a method for battery charging.

FIG. 8 depicts another embodiment of a method 800 for battery charging. The method 800 begins, and a charging connector 202 is connected 802 to power terminals 442 of a battery 440. A data connector 204 is connected 804 to the battery 440. The data connector 204 may be connected 804 to data terminals 444 of the battery 440. A data module 402 reads 806 battery data via the data connector 204. A charge module 404 charges 808 the battery 440 by supplying a power level to the battery 440, via the charging connector 202, based on the battery data, and the method 800 ends.

Figure 9:
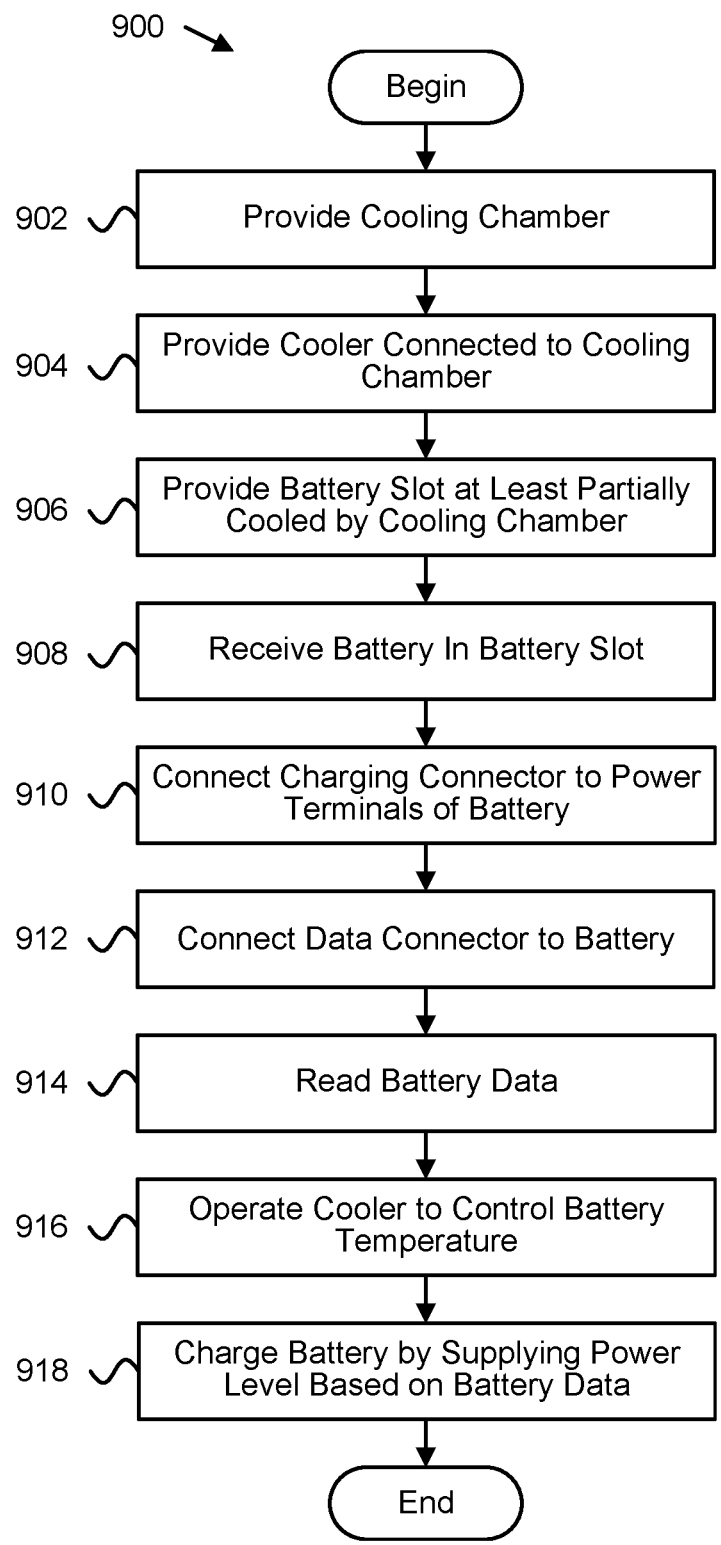
FIG. 9 is a flowchart diagram illustrating another embodiment of a method for battery charging.

FIG. 9 depicts another embodiment of a method 900 for battery charging. The method 900 begins. The method 900 includes providing 902 a cooling chamber 102. The method 900 includes providing 904 a cooler 106 connected to the cooling chamber 102. The method 900 includes providing 906 a battery slot 104 at least partially cooled by the cooling chamber 102. The battery slot 104 receives 908 a battery 440. A charging connector 202 is connected 910 to power terminals 442 of the battery 440. A data connector 204 is connected 912 to the battery 440. The data connector 204 may be connected 912 to data terminals 444 of the battery 440. A data module 402 reads 914 battery data via the data connector 204. A cool module 406 operates 916 the cooler 106 to control a temperature of the battery 440. A charge module 404 charges 918 the battery 440 by supplying a power level to the battery 440, via the charging connector 202, based on the battery data, and the method 900 ends.

Figure 10:
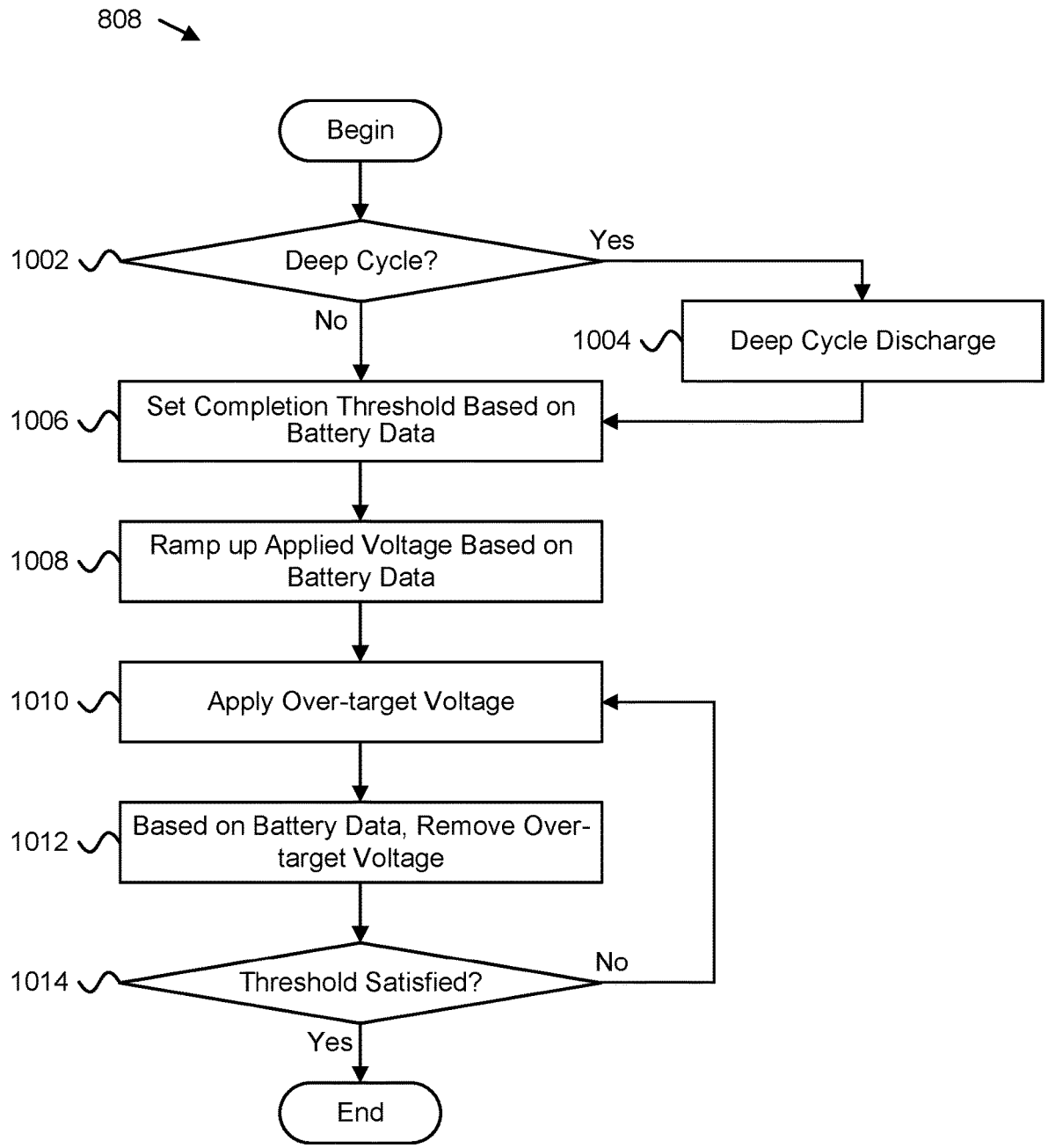
FIG. 10 is a flowchart diagram illustrating a further embodiment of a method for battery charging.

FIG. 10 depicts a further embodiment of a method for charging 808 a battery 440 by supplying a power level based on battery data, as described above with regard to FIG. 8. In the depicted embodiment, the method includes charging 808 a battery 440 as described above with regard to FIG. 8, and may be substantially similar to charging 918 a battery 440 as described above with regard to FIG. 9. In one embodiment, a charge module 404 determines 1002 whether to perform a deep cycle discharge for a battery 440. If so, the charge module 404 performs 1004 the deep cycle discharge. In a certain embodiment, a charge module 404 sets 1006 a completion threshold based on battery data read by the data module 402. In one embodiment, the charge module 404 ramps up 1008 an applied voltage based on the battery data. In one embodiment, the charge module 404 iteratively applies 1010 an over-target voltage, and removes 1012 the over-target voltage based on the battery data, until determining 1014 that the completion threshold is satisfied 1014, and the method for charging 808 a battery 440 ends.

In certain embodiments, some of the steps of the depicted method for charging 808 a battery 440 may be performed, while other depicted steps may be omitted. For example, in another embodiment, charging 808 may not include determining 1002 or performing 1004 a deep cycle discharge. In one embodiment, a charge module 404 may use a predetermined completion threshold. In a certain embodiment, a charge module 404 may apply a non-ramping voltage based on the battery data. In another embodiment, a charge module 404 may apply a voltage based on battery data until determining 1014 that a completion threshold is satisfied, without iteratively applying 1010 and removing 1012 an over-target voltage. Various other or further ways to charge a battery 440 by supplying a power level based on battery data will be clear in view of this disclosure.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a charging connector configured to connect to power terminals of a battery;
    a data connector configured to connect to the battery; and
    a charger controller configured to:
        read battery data from the battery via the data connector, and
        charge the battery via the charging connector by ramping up an applied voltage based on the battery data and by iteratively, based on the battery data, applying and removing an over-target voltage until a completion threshold is satisfied.

2. The apparatus of claim 1, wherein the data connector comprises one or more electrical conductors distinct from electrical conductors of the charging connector.

3. The apparatus of claim 1, wherein reading the battery data comprises reading one or more of: a charge cycle count for the battery, a battery identifier, a battery temperature, a temperature per cell, a battery current, a current per cell, a battery voltage, a voltage per cell, a battery state-of-charge percentage, and one or more safety alert flags.

4. The apparatus of claim 1, wherein the charger controller is further configured to set the completion threshold based on the battery data.

5. The apparatus of claim 1, wherein the charger controller is further configured to perform a deep cycle discharge of the battery, prior to charging the battery, based on battery data other than a charge cycle count.

6. The apparatus of claim 1, further comprising:
    a cooling chamber;
    a cooler connected to the cooling chamber; and
    a battery slot at least partially cooled by the cooling chamber, the battery slot configured to receive the battery, wherein the charger controller is further configured to operate the cooler to control a temperature of the battery.

7. The apparatus of claim 1, wherein the charger controller operates the cooler to control the temperature of the battery by one or more of:
    cooling the battery prior to charging; and
    maintaining a battery temperature during charging.

8. The apparatus of claim 1, wherein the battery data read by the charger controller includes initial data and additional data read by the charger controller while charging the battery.

9. The apparatus of claim 8, wherein the charger controller is further configured to store the battery data, and to provide a user with access to the stored data.

10. The apparatus of claim 9, wherein the charger controller is further configured to provide the user with a predicted remaining lifetime for the battery based on the battery data.

11. The apparatus of claim 9, wherein charger controller is further configured to retire the battery from use based on the battery data.

12. A system comprising
    a battery configured to provide power to an electrical device;
    a charging apparatus separate from the electrical device, the charging apparatus comprising:
        a charging connector configured to connect to power terminals of the battery;
        a data connector configured to connect to the battery; and
        a charger controller configured to read battery data from the battery via the data connector, and to charge the battery via the charging connector by ramping up an applied voltage based on the battery data and by iteratively, based on the battery data, applying and removing an over-target voltage until a completion threshold is satisfied.

13. The system of claim 12, wherein the charger controller is further configured to set the completion threshold based on the battery data.

14. The system of claim 12, wherein the charging apparatus further comprises:
    a cooling chamber;
    a cooler connected to the cooling chamber; and a battery slot at least partially cooled by the cooling chamber, the battery slot configured to receive the battery, wherein the charger controller is further configured to operate the cooler to control a temperature of the battery.

15. A method comprising:

connecting a charging connector to power terminals of a battery;

connecting a data connector to the battery; and reading battery data from the battery via the data connector, and charging the battery via the charging connector by ramping up an applied voltage based on the battery data and by iteratively, based on the battery data, applying and removing an over-target voltage until a completion threshold is satisfied.

16. The method of claim 15, further comprising setting the completion threshold based on the battery.

17. The method of claim 15, further comprising:

providing a cooling chamber;

providing a cooler connected to the cooling chamber; and providing a battery slot at least partially cooled by the cooling chamber;

receiving the battery in the battery slot; and operating the cooler to control a temperature of the battery.

* * * * *